(12) United States Patent
Nishikawa et al.

(10) Patent No.: US 6,356,093 B2
(45) Date of Patent: *Mar. 12, 2002

(54) PRINTED CIRCUIT BOARD TESTING APPARATUS

(75) Inventors: Hideo Nishikawa, Kyoto; Kazuhiko Kaku, Kanazawa, both of (JP)

(73) Assignee: Nidec-Read Corporation, Uji (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/324,166

(22) Filed: Jun. 2, 1999

(30) Foreign Application Priority Data

Jun. 2, 1998 (JP) .......................... 10-153108

(51) Int. Cl.[7] .................. G01R 31/02; G01D 21/00; H04N 7/18

(52) U.S. Cl. .................. 324/758; 324/754; 324/761; 33/645; 348/141

(58) Field of Search .................. 324/758, 754, 324/761, 765; 33/645; 348/141

(56) References Cited

U.S. PATENT DOCUMENTS

| | | | | |
|---|---|---|---|---|
| 4,677,474 A | * | 6/1987 | Sato et al. ................. | 348/87 |
| 4,820,975 A | * | 4/1989 | Diggle ..................... | 324/758 |
| 4,934,064 A | * | 6/1990 | Yamaguchi et al. ........ | 33/645 |
| 4,985,676 A | * | 1/1991 | Karasawa .................. | 324/754 |
| 5,644,245 A | * | 7/1997 | Saitoh et al. .............. | 324/754 |

FOREIGN PATENT DOCUMENTS

| | | | | |
|---|---|---|---|---|
| JP | 5073149 | | 3/1993 | |
| JP | 6118115 | | 4/1994 | |
| JP | 06118115 | * | 4/1994 | ................. 324/555 |

* cited by examiner

*Primary Examiner*—Safet Metjahic
*Assistant Examiner*—Anjan K. Deb
(74) *Attorney, Agent, or Firm*—Smith Patent Office

(57) ABSTRACT

A printed circuit board testing apparatus includes a first measuring system for determining a relative position between a circuit board carrying table and a test head with respect to two dimensions and an angular direction, a second measuring system for determining a relative position between the table and a circuit board carried by the table with respect to two dimensions and an angular direction, and a drive system for bringing the table and the test head into a first relative positional relationship for the testing of the circuit board in accordance with the relative positions determined by the first and second measuring systems.

15 Claims, 17 Drawing Sheets

PRINTED CIRCUIT BOARD TESTING APPARATUS

This application is based on patent application No. 10-153108 filed in Japan, the contents of which is hereby incorporated by reference.

BACKGROUND OF THE INVENTION

1. Field of the Invention

This invention relates to a printed circuit board testing apparatus for testing open circuit and current leakage or conductivity of a circuits pattern formed on a printed circuit board.

2. Discussion of the Related Art

A circuit board testing apparatus is disclosed, for example, in Japanese Unexamined Patent Publication No. (Hei) 5-73149 and Japanese Unexamined Patent Publication (Hei) 6-118115. In such circuit board testing apparatus, a circuit pattern on a circuit board is tested by the process of loading the circuit board on a transfer table, moving the transfer table to a position under a test head, and then lowering the test head to the transfer table to thereby allow contacts, such as checker pins or probe pins, attached on the test head to come into contact with specified positions of the circuit pattern formed on the circuit board. When the circuit board is placed at a designed position on the transfer table, and the transfer table is moved to the target position below the test head, the contacts provided on the test head come into the designed positional relationship with the circuit pattern of the circuit board, thereby assuring correct testing. However, it has been difficult practically to place a circuit board at the designed position on the transfer table.

The conventional circuit board testing apparatus is provided with a camera to pick up an image of a positioning mark provided on a circuit board to confirm a correct setting of the circuit board on the transfer table. Specifically, the amount of displacement of the circuit board with respect to the transfer table is calculated based on the thus-obtained mark image. In accordance with the calculated amount of displacement, the relative position of the test head and the transfer table is adjusted to compensate the displacement.

However, it is necessary to establish a correct positional relationship in advance between the transfer table carrying a circuit board and the test head provided with the contacts. In the conventional circuit board testing apparatus, a trial and error operation must be performed to determine the position of the camera until the positioning mark provided on the circuit board coincides with the optical axis of the camera, and render the contacts of the test head to come into the correct positional relationship with the circuit pattern on the circuit board.

Also, there has been proposed a circuit board testing apparatus which is provided with a test head having the so-called flying probes or movable contacts which move from one position to another position on a circuit pattern in accordance with a predetermined program to inspect a plurality of electrically conductive paths on the circuit board with a pair of the probes or contacts. The provision of movable contacts enables different types of circuit boards to be tested by the same test head. However, in such a type of testing apparatus, the number of contacts are limited. Accordingly, each of the contacts must come into contact with the circuit board an increased number of times, consequently the tip of each contact wears off in a short time. This requires frequent replacement of the contacts or the probes. At each replacement, it is necessary to adjust the positional relationship to ensure correct matching of the tip of a replaced contact with the specified position of the circuit pattern.

Further, recent circuit boards are formed with a more complicated circuit pattern. Accordingly, more precise positional control is required for the contact or probe to meet or come into contact with the specified position of the circuit pattern.

With the conventional circuit board testing apparatus, the adjustment of positional relationship between the contacts on the probes and a circuit board to be tested is performed manually by the operator. Accordingly, the more complicated the circuit pattern is, the more the load for the operator is, consequently lowering the operational efficiency for circuit board testing. Further, the troublesome adjustment of the positional relationship between the test head and the circuit board carrier or the transfer table must be performed each time a test head is replaced with another because each test head has its own dimensional characteristic. Furthermore, even during the testing operation using the same test head, it has been necessary to adjust the position of the positioning mark image pick-up camera at a specified interval. This is because the relative position between the camera (or the test head) and the transfer table changes with repeated testing operations, possibly lowering the accuracy of the test. Accordingly, the operator is required to carry out the troublesome adjustment of the positional relationship or the camera position frequently, thus resulting in a tremendous load for the operator.

SUMMARY OF THE INVENTION

It is an object of the present invention to provide a circuit board testing apparatus and method which are free from the problems residing in the prior art.

It is another object of the present invention to provide a circuit board testing apparatus that enables precise positioning of a circuit board relative to test probes or contacts.

It is further object of the present invention to provide a circuit board testing apparatus which can be easily operated but ensures precise control of the relative positions of the test head and a circuit board to be tested.

It is another object of the present invention to provide a circuit board testing apparatus which automatically determines and adjusts relative position of a circuit board to be tested and a test head or test probes carried thereon.

It is a still further object of the present invention to provide a method of automatically determining and adjusting the relative position of a circuit board to be tested and a test head or test probes carried thereon.

In one aspect of the present invention, a printed circuit board testing apparatus includes a first measuring system for determining a relative position between a circuit board carrying table and a test head with respect to two dimensions and an angular direction, a second measuring system for determining a relative position between the table and a circuit board carried by the table with respect to two dimensions and an angular direction, and a drive system for bringing the table and test head into a first relative positional relationship for the testing of the circuit board in accordance with the relative positions determined by the first and second measuring systems.

In another aspect of the present invention, a method for adjusting the relative position of a circuit board to be tested and a test head, includes determining a relative positional relationship between a circuit board carrying table and a test head with respect to two dimensions and an angular direction; determining a relative positional relationship between the table and the circuit board carried by the table. The table and the test head are moved in accordance with the determined relative positional relationships.

According to an embodiment of the present invention, the circuit board carrying table is movable in a first direction as identified by the Y direction, for example. The drive system first transports the table to a predetermined position relative to the test head. The first measuring system determines the positions of two points on the test head relative to a particular point of the table at the second relative positional relationship. The drive system drives the test head in the Y direction, in a second direction perpendicular to the Y direction and referred to as X direction by for example in the embodiment, and in angular direction. An adjusting mechanism controls a test head driving mechanism to adjust the positional relationship of the test head with the table such that the test head is in parallel with the table.

In an embodiment, the relative position between the particular point on the table and the two points on the test head may be identified by coordinates in a coordinate system with x and y axes extending in the X and Y directions with its origin being coincident with the particular point on the table. The test head driving mechanism adjusts the position of the test head in accordance with the x and y coordinates of the two points on the test head such that the y coordinates of the two points become equal to each other. Then, the table is returned back to an initial or preparatory position where a circuit board to be tested is mounted. The table carrying the circuit board is transported to a testing position in accordance with the y coordinates of the two points of the test head at the adjusted position. The test head may be driven in X direction in accordance with the x coordinates. The data determined by the second measuring system are used to correct or compensate the amount of movement of the table and the test head.

In the embodiment of the present invention, the first measuring system includes a mechanism to bring the table and the test head into a first, second and third relative positional relationship. The positions of the two points on the test head are determined as a function of the relative movement of the table and the test head from the first, second, and third relative positional relationships. The first, second and third relative positional relationships may be determined by target marks fixed on them and an image taking device such as camera.

These and other objects, features and advantages of the present invention will become more apparent upon a reading of the following detailed description and accompanying drawings.

THE DETAILED DESCRIPTION OF PREFERRED EMBODIMENTS OF THE INVENTION

Figure 1:
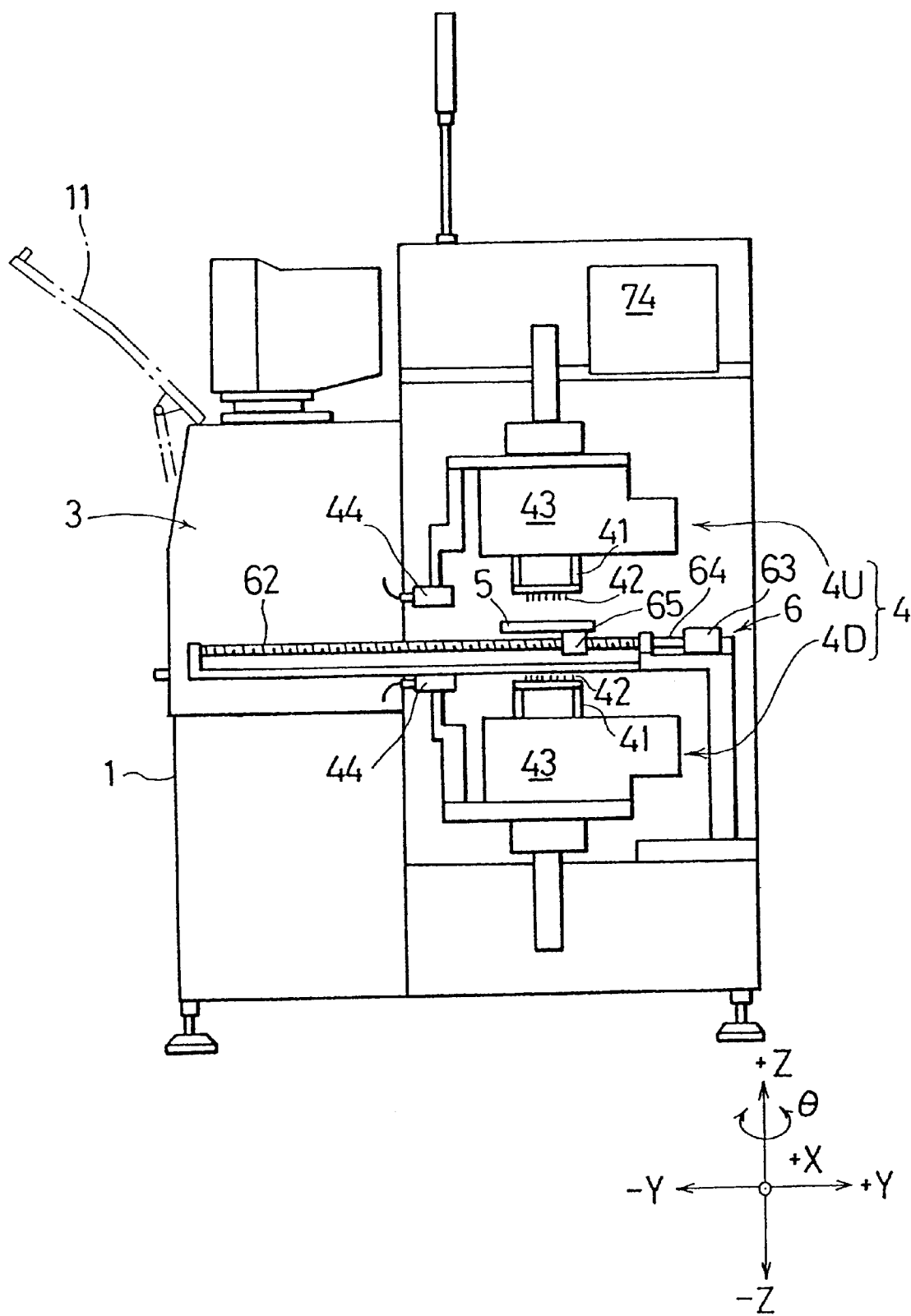
FIG. 1 is a schematic side view of a circuit board testing apparatus as a first embodiment of the present invention.
Figure 2:
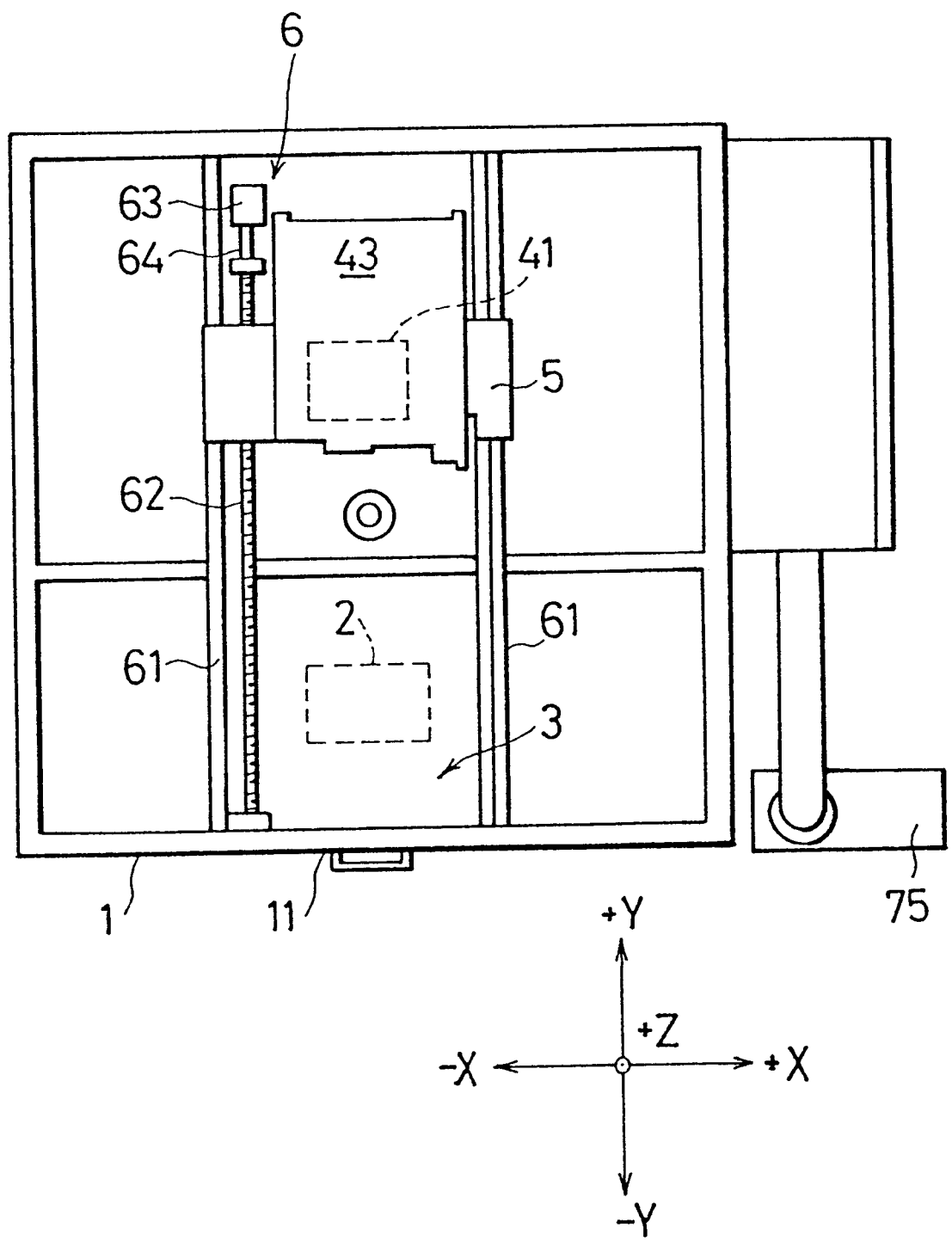
FIG. 2 is a schematic top plan view of the circuit board testing apparatus shown in FIG. 1.

FIG. 1 shows a schematic side view of a circuit board testing apparatus according to the first embodiment of the present invention, and FIG. 2 is a schematic top plan view of the same circuit board testing apparatus. In order to clarify directions of movement and relative positions of the parts of the apparatus in drawings, X, Y and Z axes of rectangular coordinates are shown.

The circuit board testing apparatus includes a door 11 provided on the front (−Y side) of a main body 1 of the apparatus. The door 11 is opened to place a printed circuit board 2 to be tested in an initial position 3 provided in a middle portion of a forward chamber of the apparatus. The printed circuit board to be tested may be a bare printed circuit board on which an electric circuit pattern is printed but circuit elements such as IC chips, capacitors, resistors have not been mounted. Further, on the rear (+Y side) of the initial position 3 is provided a test section 4 where the circuit board 2 is tested or inspected. The signals representative of conductivity between points on the circuit pattern of the circuit board 2 are picked up or detected to evaluate the circuit board 2 to accept or deny. The tested circuit board 2 is returned to the initial position 3 where the tested board is in turn taken out through the front opening by the operator.

In this embodiment, circuit boards 2 are manually placed in and taken out by the operator. However, automatic placement and withdrawal of circuit boards may be available with a circuit board transfer mechanism having a supply unit and a removing unit arranged on both sides of the initial position or along the X-direction. The supply unit receives circuit boards to be tested from an external device, and then places the circuit boards in the initial position 3. The removing unit takes out tested circuit boards from the initial position 3, and transfers it to the external device.

A transfer table 5 is provided to transfer a circuit board 2. The transfer table 5 is reciprocatively moved in Y-directions between the initial position 3 and the test section 4 by a transfer table drive mechanism 6. The transfer table drive mechanism 6 includes two guide rails 61 and 61 extending in the Y direction and spaced from each other in the X-direction. The transfer table 5 is slidable on those guide rails 61 and 61. In parallel with the guide rails 61 and 61, a ball screw 62 is disposed. One end (−Y side) of the ball screw 62 is rotatably supported on the main body 1 of the apparatus by way of a bearing. The other end (+Y side) is connected to a drive shaft 64 of a motor 63, whereby the ball screw 62 is rotated by the motor 63. Also, the ball screw 62 threads through a bracket 65 fixedly attached on the transfer table 5. The ball screw 62 and the bracket 65 are mechanically associated with each other such that when the motor 63 is permitted to drive in response to a command from a controller to be described later, the transfer table 5 is moved in the Y direction, that is, to the initial position 3 or to the test section 4. The movement of the transfer table 5 corresponds to the rotation of the motor 63. Details of the transfer table 5 will be described later.

The test section 4 includes an upper tester unit 4U disposed on an upper side (+Z side) of the transfer table drive mechanism 6 for testing a circuit pattern formed on a top of a circuit board 2 and a lower tester unit 4D disposed on a lower side (−Z side) of the transfer table drive mechanism 6 for testing a circuit pattern formed on an underside of the circuit board 2. Both tester units 4U and 4D have the same configuration and are symmetrically disposed with respect to the travel path of the transfer table 5. Therefore, the configuration of the upper tester unit 4U will be only described. The same numerals are given to the corresponding parts of the lower tester unit 4D and its description is not made here for the simplicity of description. It is to be noted that the following description can apply to the lower tester unit 4D.

The upper tester unit 4U includes a test head 41 carrying a plurality of contacts 42. The contacts 42 project from the test head 41, and their respective tips face the transfer table 5 at a test position. After being positioned relative to the circuit board 2 on the transfer table 5 as described later, the contacts are brought into contact with the circuit pattern on the circuit board 2 by a test head drive mechanism 43 which is controlled by the controller.

Figure 3:
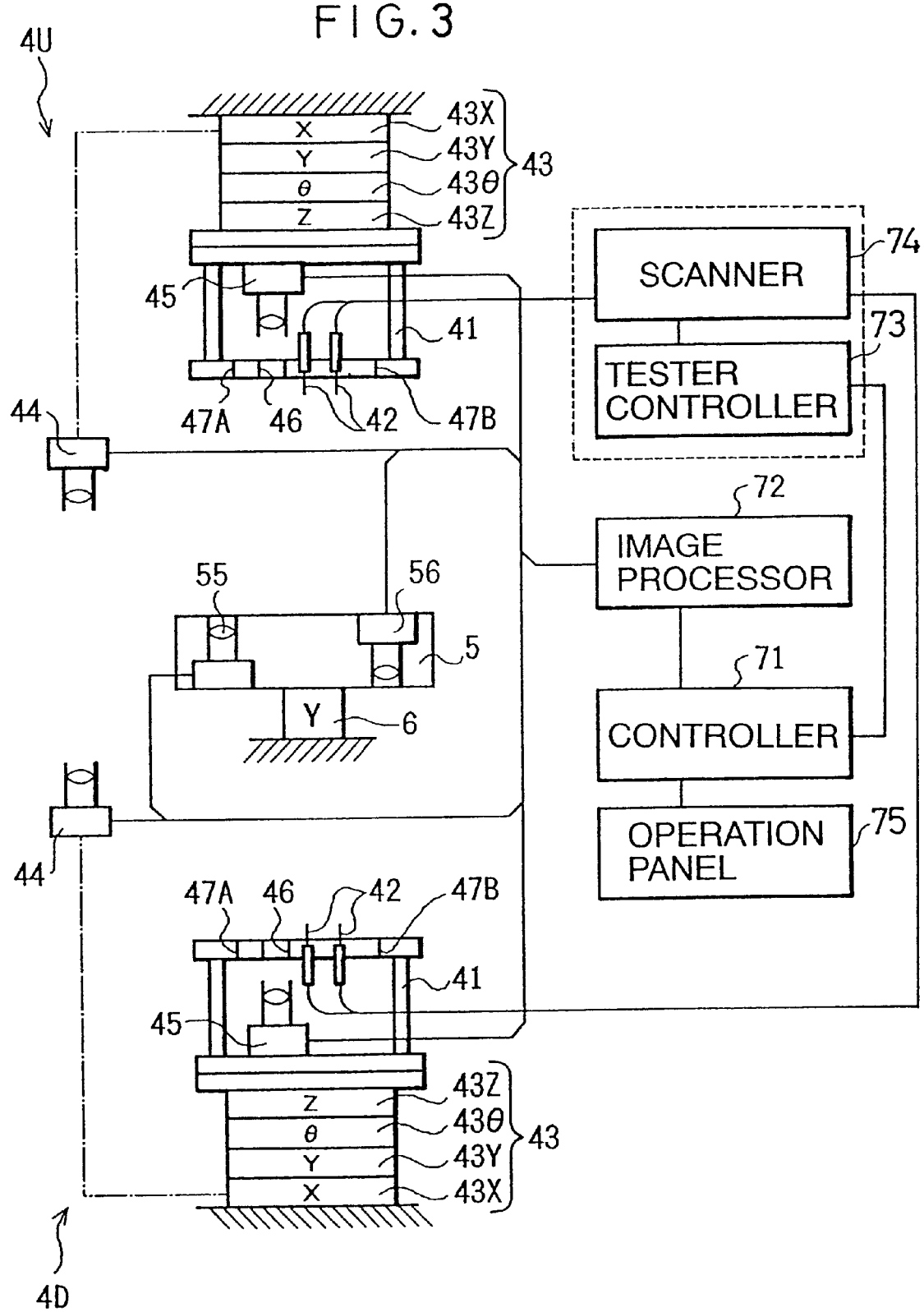
FIG. 3 is a diagram showing a main construction of the circuit board testing apparatus.

Referring to FIG. 3, the test head drive mechanism 43 is provided with an X-head drive section 43X for moving the test head 41 in the X direction with respect to the main body 1, a Y-head drive section 43Y connected with the X-head drive section 43X for moving the test head 41 in the Y direction, a θ-head drive section 43θ connected with the Y-head drive section 43Y for turning the test head 41 about the Z-axis, and a Z-head drive section 43Z connected with θ-head drive section 43θ for moving the test head 41 in the Z direction, whereby the test head 41 is positioned relative to the transfer table 5, and the contacts 42 are moved toward and away from the circuit pattern formed on the circuit board 2.

Further, a main camera 44 is mechanically connected to the X-head drive section 43X so as to move in the X direction integrally with the test head 41.

On the test head 41 is provided, as shown FIG. 3, a confirmation camera 45 for confirming the relative position of the circuit board 2 and the test head 4. The confirmation camera 45 picks up an image of a board positioning mark provided on the circuit board 2 placed on the transfer table 5 through a through hole 46 formed on the test head 41. Indicated at 47A and 47B are head positioning marks which are arranged in the X-direction symmetrically on the right and left of a designed center of the test head 41. The head positioning marks face the transfer table 5 at its test position.

Figure 4:
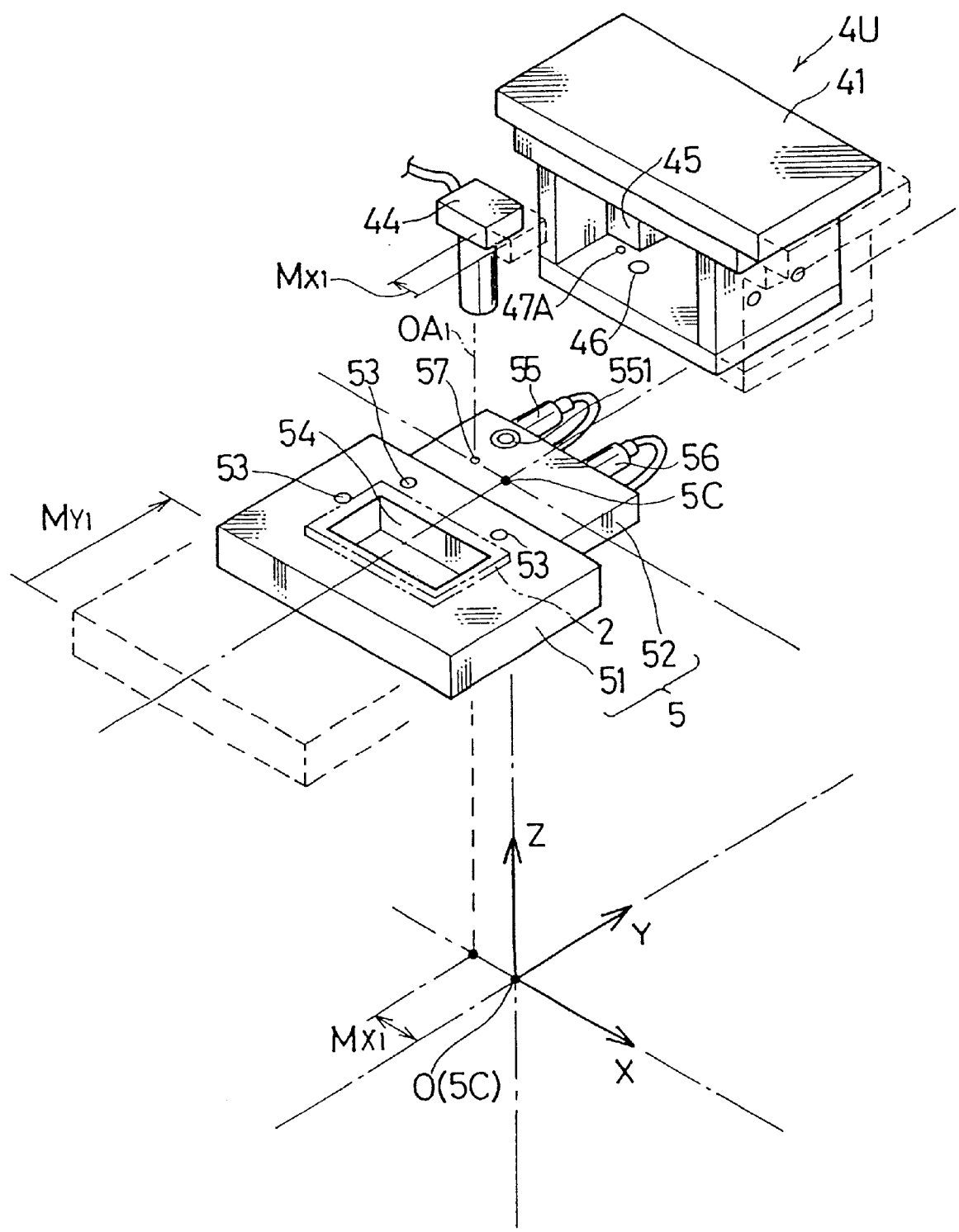
FIG. 4 is a perspective view showing an operation of the circuit board testing apparatus.

Next will be described a configuration of the transfer table 5 with reference to FIGS. 4 and 5. The transfer table 5 includes, as shown in FIG. 4, a circuit board holder section 51 for retaining a circuit board 2 and an auxiliary camera carrier section 52 protruding in the +Y-direction from the circuit board holder section 51. The circuit board holder section 51 is provided with three retainer pins 53. A circuit board 2 is pushed against the three retainer pins 53 by a biasing member (not shown), thereby being firmly retained on the holder section 51 of the transfer table 5.

Further, the circuit board holder section 51 of the transfer table 5 is formed with an opening 54 in a specified area thereof. The opening 54 is adapted for allowing the contacts or probes 42 of the lower tester unit 4D to come into contact with a circuit pattern formed on the underside of the circuit board 2 represented by the phantom lines.

The auxiliary camera carrier section 52 is provided with auxiliary cameras 55 and 56. These cameras are arranged side by side in the X direction. The auxiliary camera 55 is adapted for picking up an image of the head positioning marks 47A and 47B (but, only 47A is shown in FIG. 4) provided on the test head 41 of the upper tester unit 4U. The auxiliary camera 56 is adapted for picking up an image of the head positioning marks 47A and 47B provided on the test head 41 of the lower tester unit 4D. The auxiliary cameras 55 and 56 have the same configuration as each other. Accordingly, only the configuration of the auxiliary camera 55 will be described here. The same description applies to the configuration of the other auxiliary camera 56.

Figure 5:
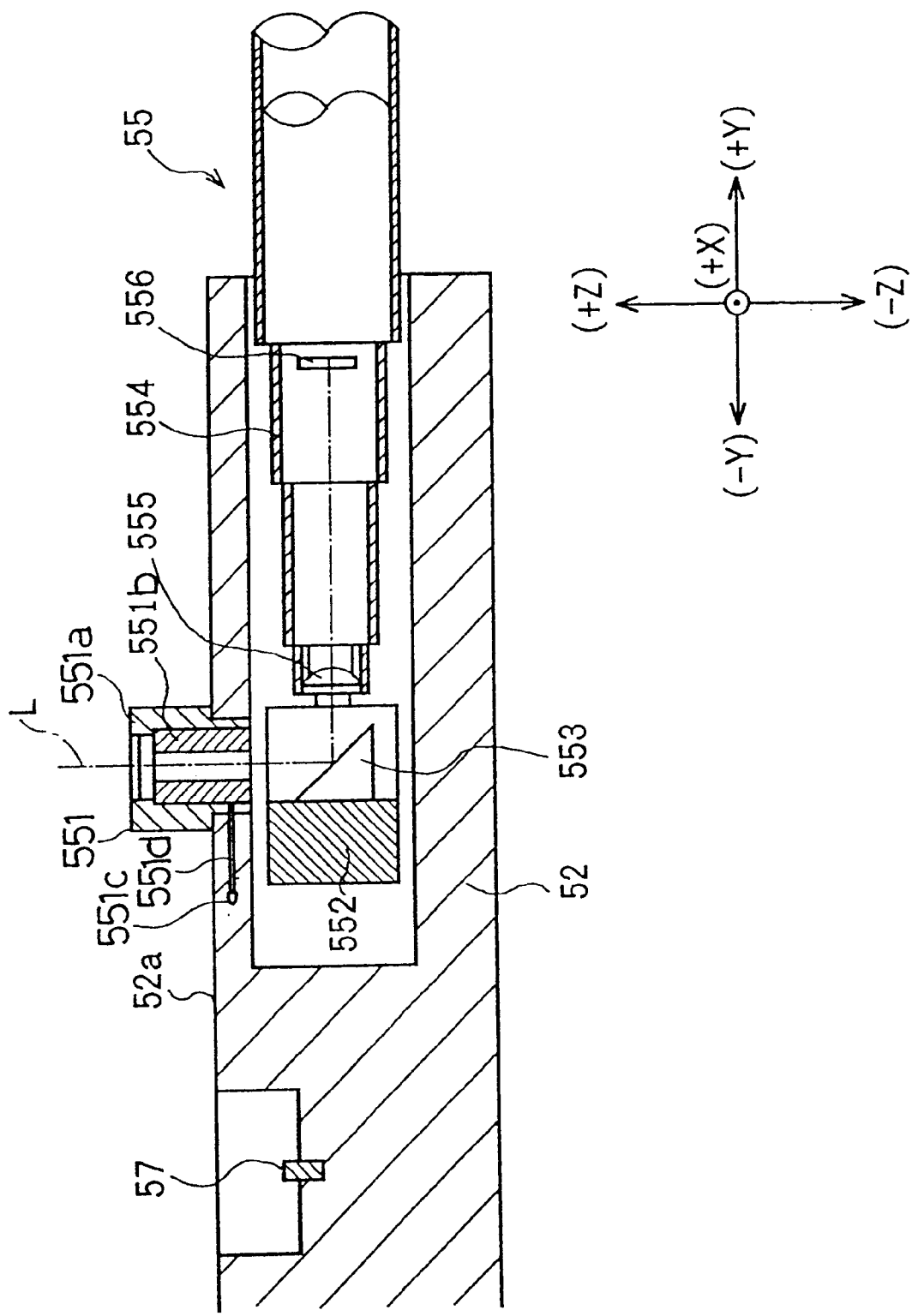
FIG. 5 is a sectional view showing a configuration of an auxiliary camera provided in the circuit board testing apparatus.

Referring to FIG. 5, the auxiliary camera 55 mainly includes an illumination member 551, a prism 553, a barrel 554, a lens 555, and a charge-coupled device (CCD) 556.

The illumination member 551 is provided on a top surface 52a of the auxiliary camera carrier section 52 to illuminate the upper tester unit 4U. The illumination member 551 is composed of an outer metal cylinder 551a and an inner light diffuser 551b. The inside wall of the metal cylinder 551a is light reflective. The light diffuser 551b also has a cylindrical shape but is made of a light diffusing or transparent material such as acrylic plastic or glass. Light from a light source 551c provided in the auxiliary camera carrier section 52 is introduced to the light diffuser through a light guide 551d such as a glass fiber. The light is diffused in the diffuser 551b, and emitted from the upper end of the diffuser 551b in a ring shape to illuminate the head positioning mark 47A or 47B. The center of the illumination member 551 coincides with the optical axis of the auxiliary camera 55.

The prism 553 is held by a prism holder 552 provided inside the auxiliary camera carrier section 52, and serves to introduce light rays L reflected from the upper tester unit 4U through the illumination member 551 to the lens 555. The lens 555 focuses the light rays L onto the CCD 556.

Further, a table positioning mark 57 is provided on the bottom surface of the recess formed in the top surface 52a of the auxiliary camera carrier section 52 of the transfer table 5. The table positioning mark 57 is spaced a predetermined distance from the illumination member 551 of the auxiliary camera 55.

The auxiliary camera 55 has a field of view about twice as large in diameter than the head positioning marks 47A and 47B. The transfer table 5 and the test head 41 are relatively moved to a position where the head positioning mark 47A or 47B comes into the field of view of the auxiliary camera 55 in accordance with positional data stored in the controller 71. Thereafter, the auxiliary camera 55 is activated to pick up an image of the head positioning mark 47A or 47B at a predetermined interval until the center of the head positioning mark 47A or 47B is detected to coincide with the center of the illumination member 551 or the optical axis of the auxiliary camera 55.

The main camera 44 is composed of an object lens and a CCD to take a picture. The field of view of the main camera 44 is rectangular each side of which is about twice as large as the diameter of the target mark 57. Accordingly, capturing of an image of the table positioning mark 57 is executed in a similar way. Specifically, the transfer table 5 is moved to a position in the Y-direction and the test head drive mechanism 43X is moved in Y-direction such that the table positioning mark 57 comes into the field of view of the main camera 44 in accordance with positional data stored in the controller 71. At this state, the image pick-up operation of the main camera is continued until the center of the table positioning mark 57 is detected to coincide with the optical axis of the main camera 44.

Now description will be made about an electric circuit arrangement of the circuit board testing apparatus with reference back to FIG. 3. The circuit board testing apparatus is provided with a CPU, a ROM, a RAM, a motor driver, and the controller 71. The controller 71 controls the entire operation of the apparatus in accordance with a program pre-stored in the ROM. The apparatus is further provided with an image processor 72 for processing image signals obtained by the cameras 44, 45, 55, and 56 disposed in the specified positions of the apparatus and outputting processed signals to the controller 71.

The controller 71 controls the transfer table drive mechanism 6 and the test head drive mechanism 43 based on signals from the image processor 72 to render the contacts 42 of the upper and lower tester units 4U and 4D to come into contact with the specified points of the circuit pattern formed on the circuit board 2 which is disposed on the transfer table 5.

Further, the controller 71 is electrically connected to a tester controller 73. Upon completion of the contact of the contacts 42 with the circuit pattern as mentioned above, a test start command is given to the tester controller 73 from the controller 71. The tester controller 73 permits the scanner 74 to electrically connect a signal source such as a constant voltage source with the contacts 42 alternatively or selectively to send a test signal to each of the contacts 42, thereby initiating testing. The signal applied to one end of an electric path of the circuit pattern is picked-up at the other end of the electric path, and it is determined whether the picked-up signal is at an acceptable level or not. In this way, all the electric paths are tested one by one, and the results of the determinations are accumulated to finally determine whether the circuit board is acceptable or not. With the testing completed, test results are given to the controller 71 through the tester controller 73. An operation panel 75 is electrically connected to the controller 71 to enable the operator to input instruction or set parameters to the controller 71.

Next will be described the operations of the circuit board testing apparatus.

Figure 6:
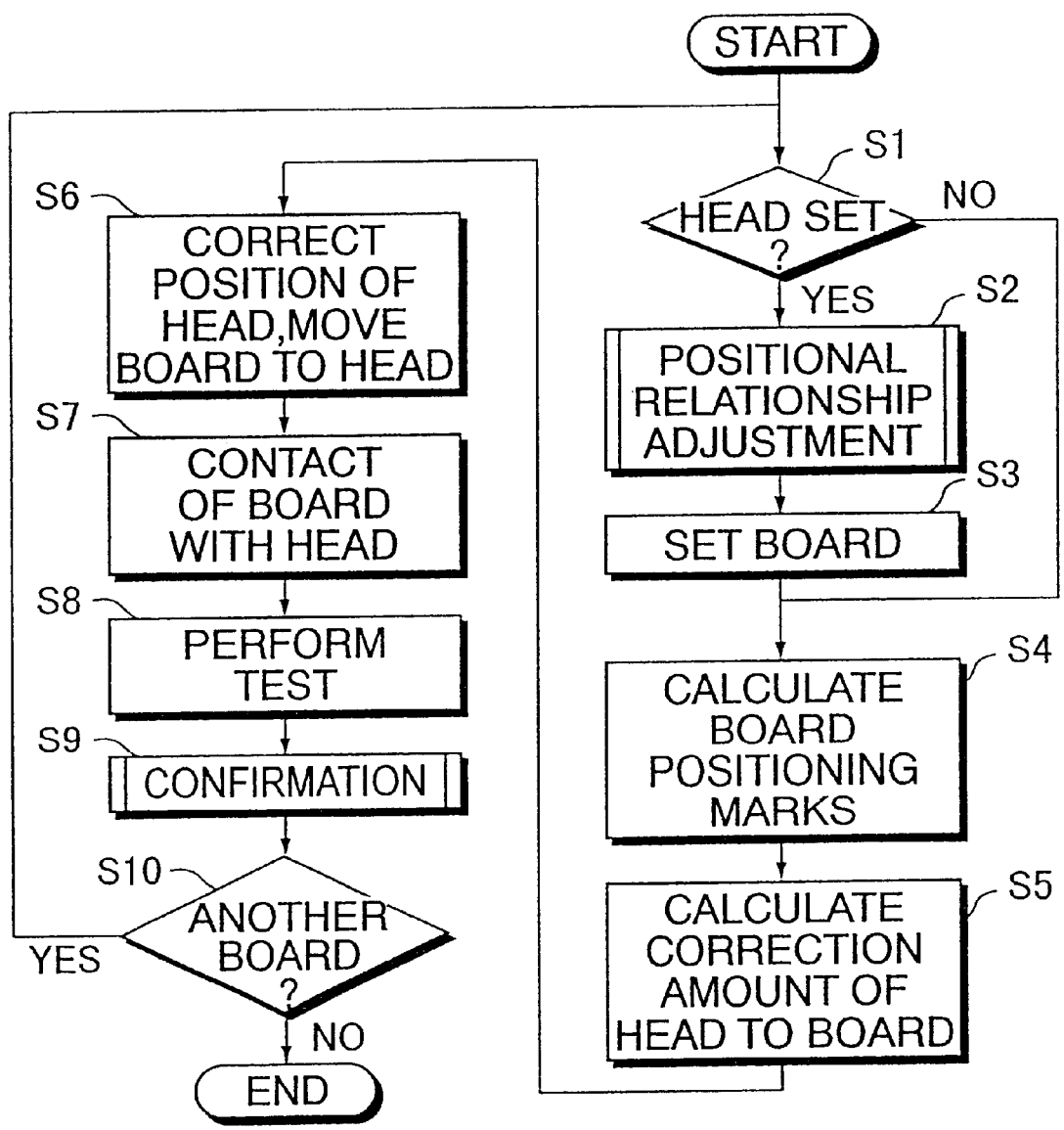
FIG. 6 is a flowchart showing a main operation of the circuit board testing apparatus.

FIG. 6 is a flowchart showing a main operation of the circuit board testing apparatus. The operator places or sets a circuit board 2 on the transfer table 5 located in the initial position 3, and gives a test command through the operation panel 75. The controller 71 outputs various commands to relevant sections of the apparatus to perform the automatic circuit board testing in accordance with the flowchart shown in FIG. 6. The upper tester unit 4U and the lower tester unit 4D both perform testing in the same operation sequence. Accordingly, the operation of the upper tester unit 4U will be described while description of the lower tester unit 4D is omitted.

Upon receiving a test command, the controller 71 first judges as to whether or not a new test head 41 is set (Step S1) on the apparatus. If it is judged to be "NO" in Step S1, the flow proceeds to Step S3 without executing adjustment of the positional relationship between the test head 4U and the transfer table 5. The circuit board testing is initiated based on the previously obtained positional relationship between the transfer table 5 and the test head 41, since the data of positional relationship has been already stored in the controller 71. On the other hand, if it is judged to be "YES" in Step S1, the adjustment of the positional relationship is executed in Step S2.

Figure 7:
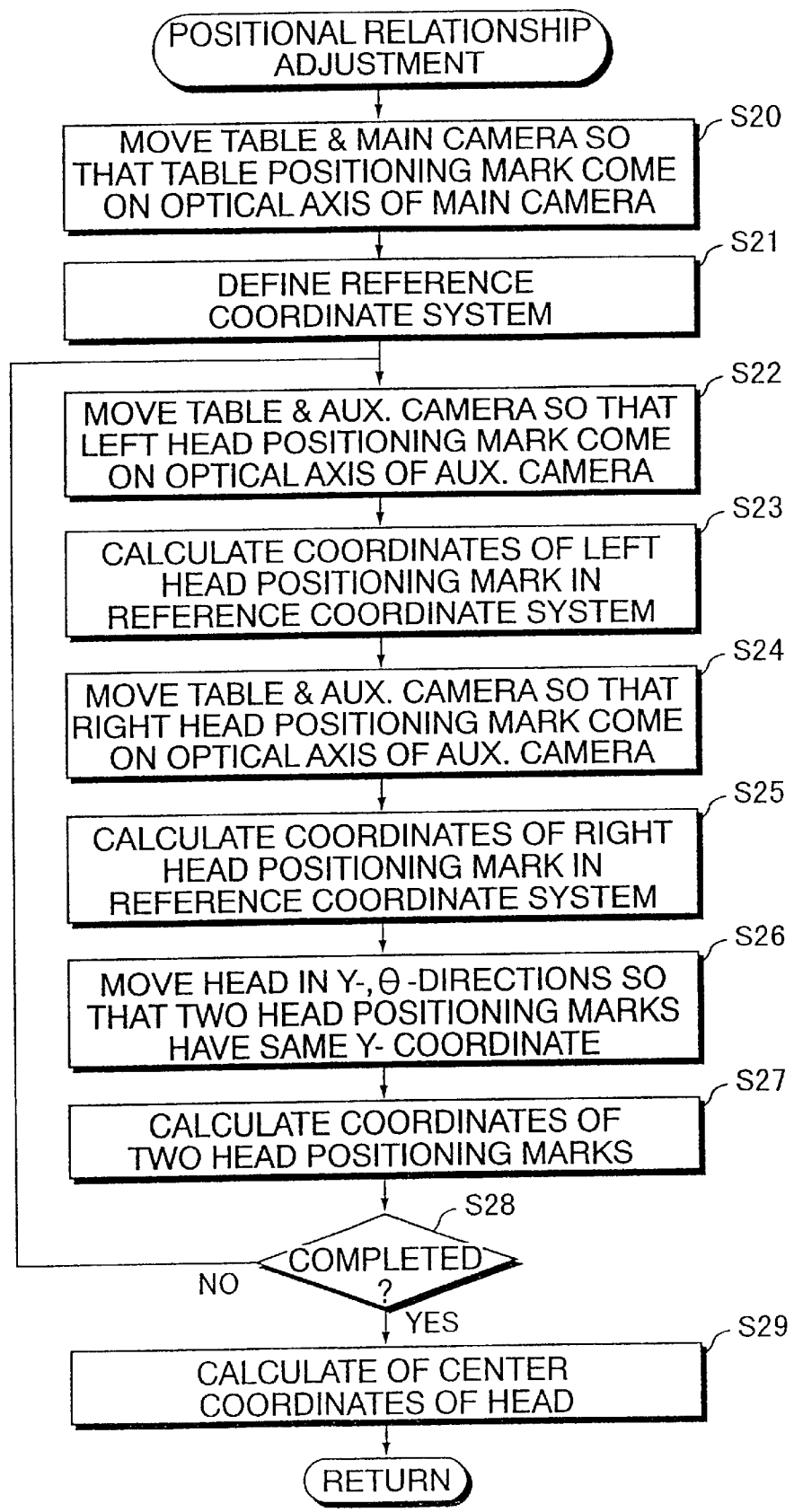
FIG. 7 is a flowchart showing the process of adjusting the positional relationship, carried out in the circuit board testing apparatus.

FIG. 7 is a flowchart showing the process of adjusting the positional relationship between the test head 4U and the transfer table 5. In adjustment of the positional relationship, the transfer table drive mechanism 6 and the X-head drive section 43X are controlled based on image signals obtained by the main camera 44 so that the table positioning mark 57 comes onto the optical axis OA1 of the main camera 44 (Step S20). Specifically, the transfer table 5 is moved for a distance of MY1 in the Y-direction from the initial position represented by the broken lines in FIG. 4 while the test head 41 carrying the main camera 44 is moved for a distance of $MX_1$ in the X-direction from the initial position. In this state, a hypothetical reference coordinate system is defined (Step S21), with its origin O being coincident with the designed center 5C of the transfer table 5.

Figure 8:
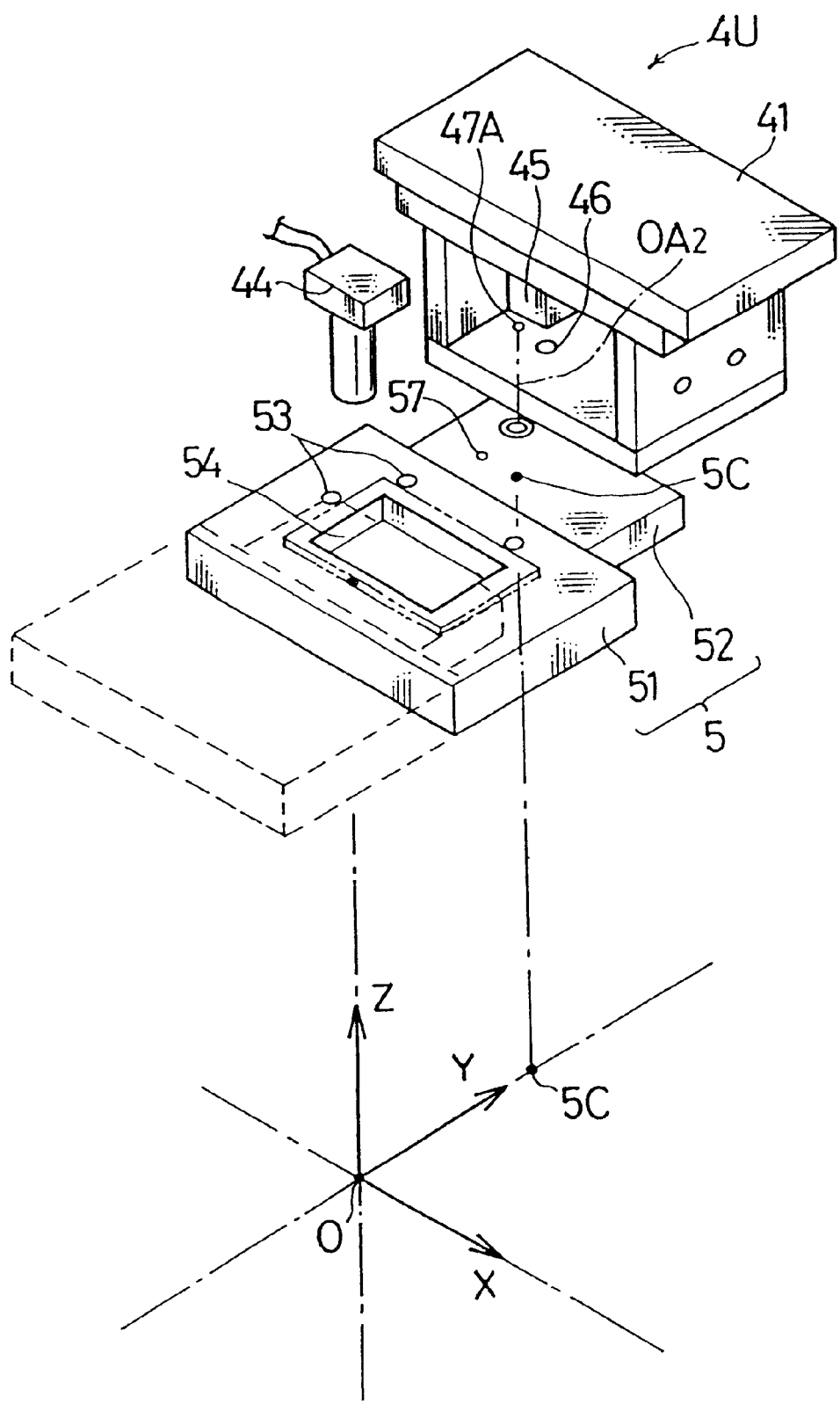
FIG. 8 is a perspective view showing another operation of the circuit board testing apparatus.

Subsequently, as shown in FIG. 8, the transfer table drive mechanism 6 and the X-head drive section 43X are driven based on image signals obtained by the auxiliary camera 55 so that the head positioning mark (left) 47A comes onto the optical axis $OA_2$ of the auxiliary camera 55 (Step S22). In other words, the transfer table 5 is moved in the Y-direction and the test head 41 is moved in the X-direction until the optical axis $OA_2$ coincides with the head positioning mark 47A. At this state, coordinates ($X_{A0}$, $Y_{A0}$) of the head positioning mark 47A with respect to the reference coordinate system is determined by the amount of movement of the transfer table 5 and the test head 41 (Step S23).

Subsequently, coordinates of the head positioning mark 47B in the reference coordinate system is determined in the same manner as Steps S22 and S23. Specifically, the transfer table drive mechanism 6 and the X-head drive section 43X are controlled based on image signals obtained by the auxiliary camera 55 so that the head positioning mark (right) 47B comes onto the optical axis $OA_2$ of the auxiliary camera 55 (Step S24). In other words, the transfer table 5 is moved in the Y-direction and the test head 41 is moved in the X-direction until the optical axis $OA_2$ coincides with the head positioning mark 47B. At this state, coordinates ($X_{B0}$, $Y_{B0}$) of the head positioning mark 47B with respect to the reference coordinate system is determined by the amount of movement of the transfer table 5 and the test head 41 (Step S25).

Next, the Y-head drive section 43Y and the θ-head drive section 43θ are activated until the two head positioning marks 47A and 47B have the same coordinate with respect to the Y-coordinate (Step S26). Thereafter, respective coordinates of the head positioning marks 47A and 47B with respect to the reference coordinate system are calculated as follows (Step S27):

Coordinates of the head positioning mark 47A $(X_{A1}, Y_{A1})$

Coordinates of the head positioning mark 47B $(X_{B1}, Y_{B1})$

Figure 9:
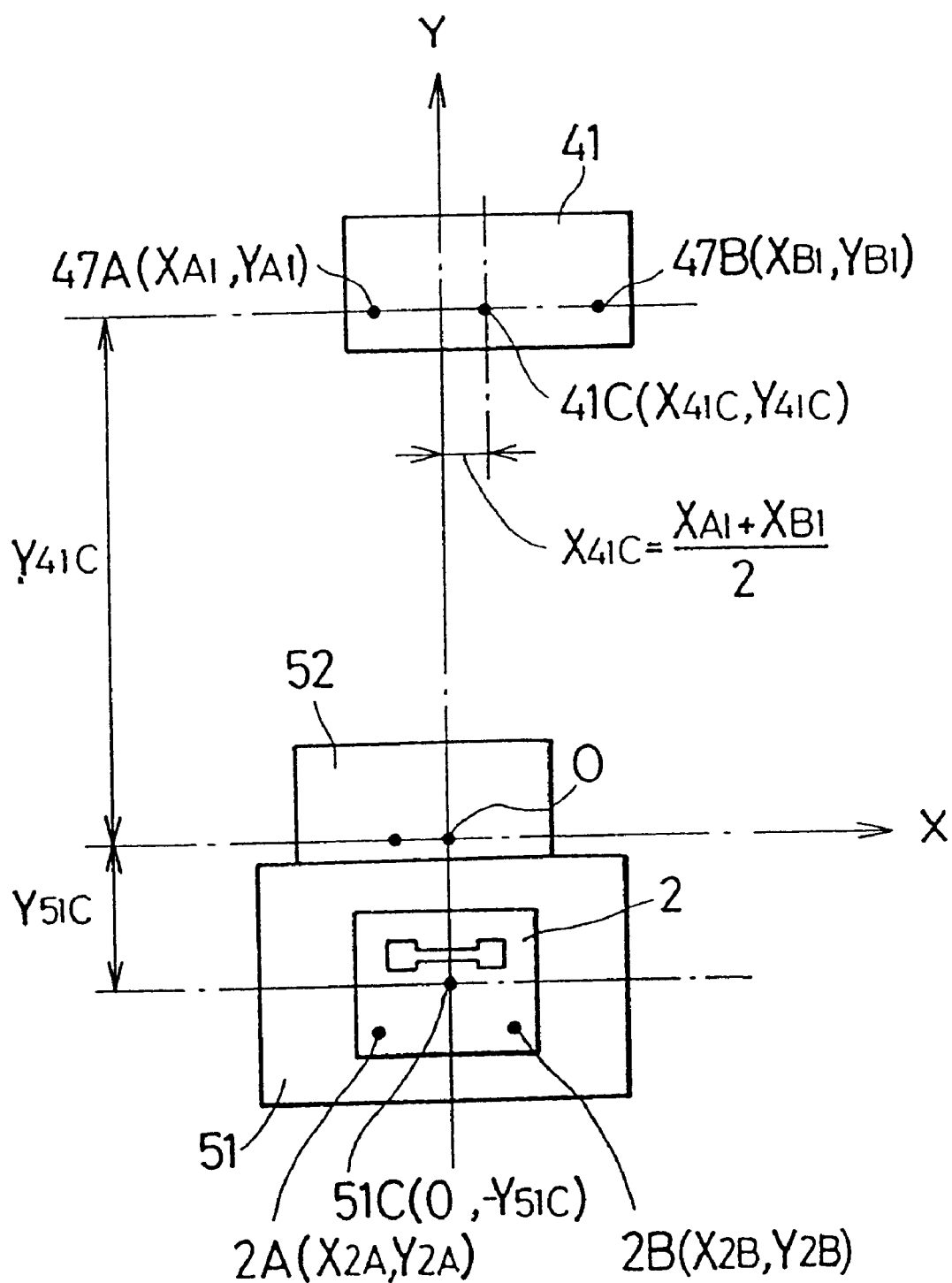
FIG. 9 is a diagram showing a positional relationship between a test head and a transfer table in the circuit board testing apparatus.

It is judged in Step S28 whether test head 41 is corrected in the Y-direction and the θ-directions. If it is judged that the correction is not completed, the flow returns to Step S22 to perform the operations of Steps S22 to S27. On the other hand, if it is judged that the correction is completed, coordinates $(X_{41C}, Y_{41C})$ of a center 41C of the test head 41 are calculated (Step S29). The center 41C of the test head 41 is shown in FIG. 9. The coordinates $(X_{41C}, Y_{41C})$ of the center 41C can be expressed as follows:

$$X_{41C}=(X_{A1}+X_{B1})/2$$

$$Y_{41C}=Y_{A1}=Y_{B1}$$

These coordinates are stored in the memory (not shown) of the controller 71 until the test head 41 is replaced with another test head.

After the adjustment of the positional relationship of the test head and the transfer table is completed (Step S2), a circuit board 2 to be tested is placed or set on the circuit board holder section 51 of the transfer table 5 (Step S3). In this embodiment, a circuit board 2 to be tested is placed on the circuit board holder section 51 by the operator. As described above, however, a circuit board 2 may be automatically placed on the circuit board holder section 5 by an automatic placement device.

Figure 10:
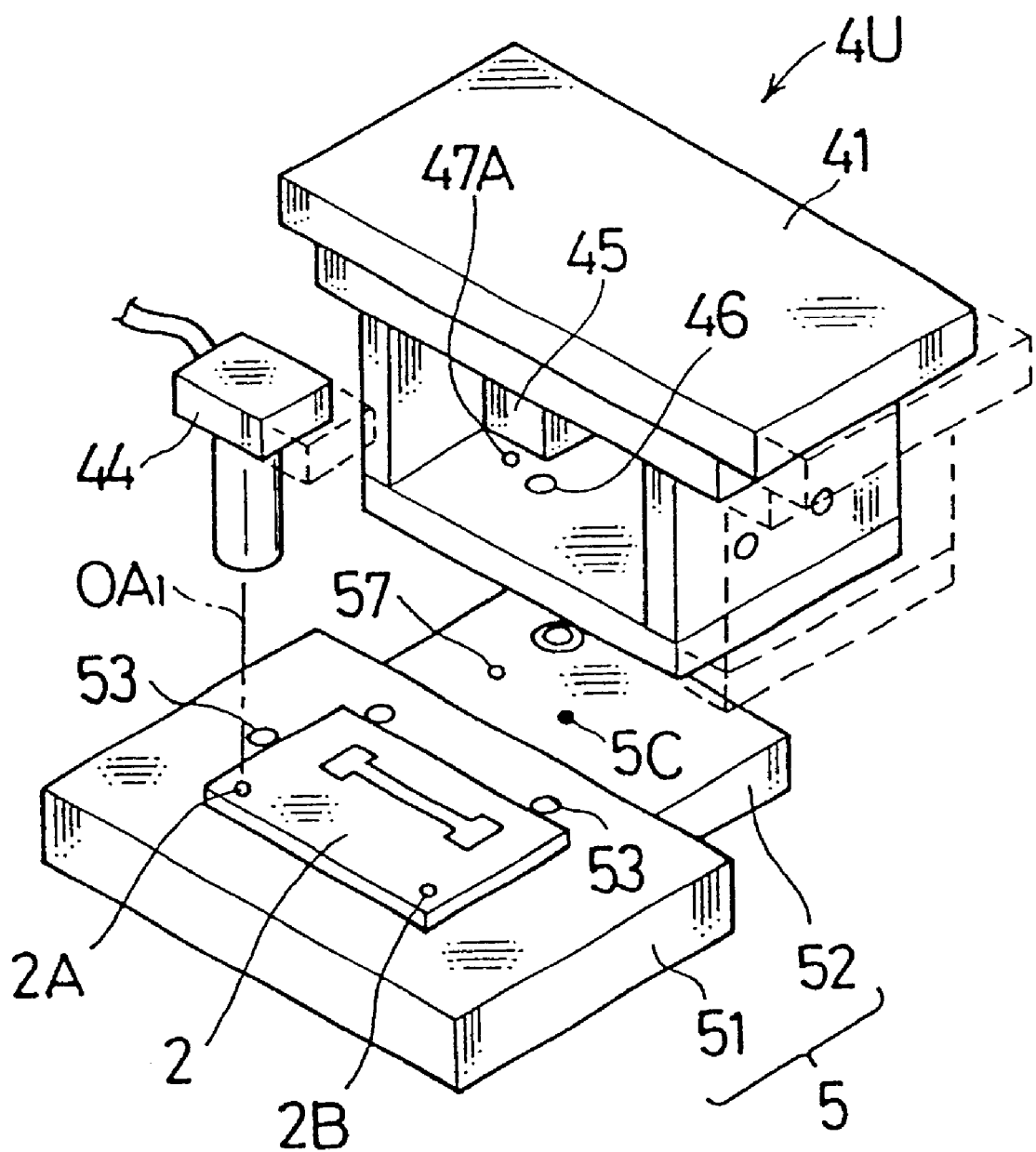
FIG. 10 is a perspective view showing another operation of the circuit board testing apparatus.

Next, coordinates of the circuit board positioning marks 2A and 2B provided on the circuit board 2 are calculated with respect to the reference coordinate system (Step S4). Specifically, as shown in FIG. 10, the transfer table drive mechanism 6 and the X-head drive section 43X are actuated to drive the transfer table 5 and the test head 41 based on image signals from the main camera 44 until the board positioning mark 2A on the circuit board 2 comes onto the optical axis OA1 of the main camera 44. In other words, the transfer table 5 is moved in the Y-direction and the test head 41 carrying the main camera 44 is moved in the X direction until the board positioning mark 2A coincides with the optical axis $OA_1$. At this state, coordinates $(X_{2A}, Y_{2A})$ of the board positioning mark 2A are calculated in accordance with the amount of movement of the transfer table 5 and the test head 41 from the original position where the designed center 5C coincides with the origin O of the reference coordinate system.

Similarly, the transfer table drive mechanism 6 and the X-head drive section 43X are actuated to drive the transfer table 5 and the test head 41 based on image signals from the main camera 44 until the board positioning mark 2B on the circuit board 2 comes onto the optical axis $OA_1$ of the main camera 44. In other words, the transfer table 5 is moved in the Y-direction and the test head 41 carrying the main camera 44 is moved in the X direction until the board positioning mark 2B coincides with the optical axis $OA_1$. At this state, coordinates $(X_{2B}, Y_{2B})$ of the board positioning mark 2B are calculated in accordance with the amount of movement of the transfer table 5 and the test head 41 from the original position.

In Step S5, thereafter, displacements $\Delta X_2$, $\Delta Y_2$, and $\Delta\theta_2$ of the placed circuit board 2 from the designed center 51C $(0, -Y_{51C})$ in X-, Y-, and θ-directions are calculated based on the above-calculated coordinates $(X_{2A}, Y_{2A})$ and $(X_{2B}, Y_{2B})$ of the board positioning marks 2A and 2B as follows:

$$\Delta X_2=\{(X_{2A}-X_{2A0})+(X_{2B}-X_{2B0})\}/2$$

$$\Delta Y_2=\{(Y_{2A}-Y_{2A0})+(Y_{2B}-Y_{2B0})\}/2$$

$$\Delta\theta_2=\tan^{-1}\times(Y_{2A}-Y_{2B})/(X_{2A}-X_{2B})--\tan^{-1}\times(Y_{2A0}-Y_{2B0})/(X_{2A0}-X_{2B0})$$

wherein $X_{2A0}$ and $Y_{2A0}$ denote designed coordinates of the board positioning mark 2A, and $X_{2B0}$ and $Y_{2B0}$ denote designed coordinates of the board positioning mark 2B. These designed coordinates are stored in the controller 71 in advance.

Subsequently, amounts $(\Delta X, \Delta Y, \Delta\theta)$ of movement of the test head 41 for the compensation for the displacement of the circuit board 2 are calculated as follows:

$$\Delta X=\Delta X_{41C}-\Delta X_2$$

$$\Delta Y=-\Delta Y_2$$

$$\Delta\theta=-\Delta\theta_2$$

In Step 6, the test head 41 is moved by the test head drive mechanism 43 by the calculated amounts for the compensation $(\Delta X, \Delta Y, \Delta\theta)$ to thereby adjust the position of the test head 41 with respect to the circuit board 2. At the same time, the transfer table 5 is moved for the distance $(Y_{41C}+Y_{51C})$ in the Y-direction by the transfer table drive mechanism 6. In this way, the transfer table 5 is set at the exact position below the test head 41. Accordingly, the contacts 42 carried by the test head 41 will come into contact with specified positions of the circuit pattern formed on the circuit board 2 with a high level of accuracy.

The test head 41 is moved to the circuit board 2 by the Z-head drive section 43Z, thereby rendering the contacts 42 of the test head 41 to come into contact with the circuit pattern of the circuit board 2 (Step S7), and testing is performed with the scanner 74 (Step S8).

However, there may be a likelihood that the circuit board 2 shifts when the contacts 42 come into contact with the circuit pattern of the circuit board 2, consequently causing an error in the testing. In this embodiment, for this reason, the matching between the contacts and the circuit pattern is judged, and the position correction is conducted if an undesired shift is judged to occur, and another testing is performed (Step S9).

Figure 11:
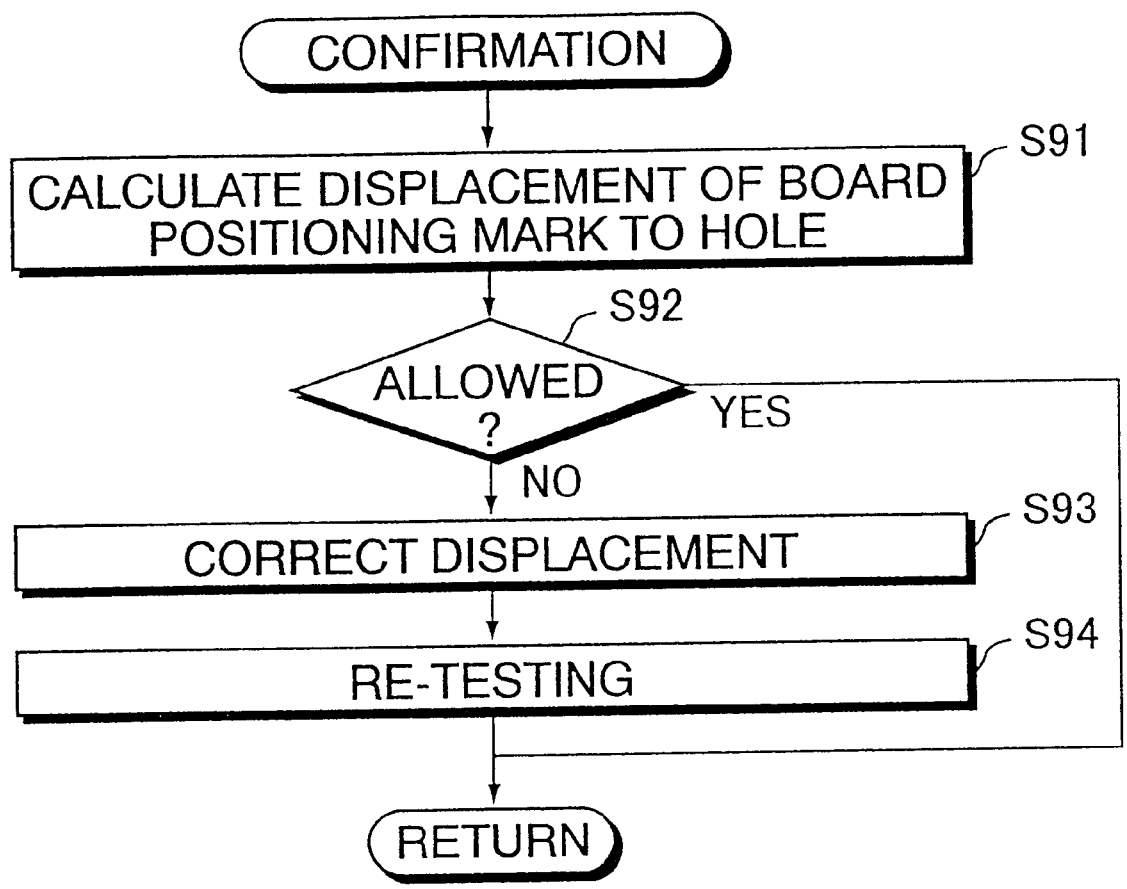
FIG. 11 is a flowchart showing the process of confirming and readjusting the alignment carried out in the circuit board testing apparatus.
Figure 12:
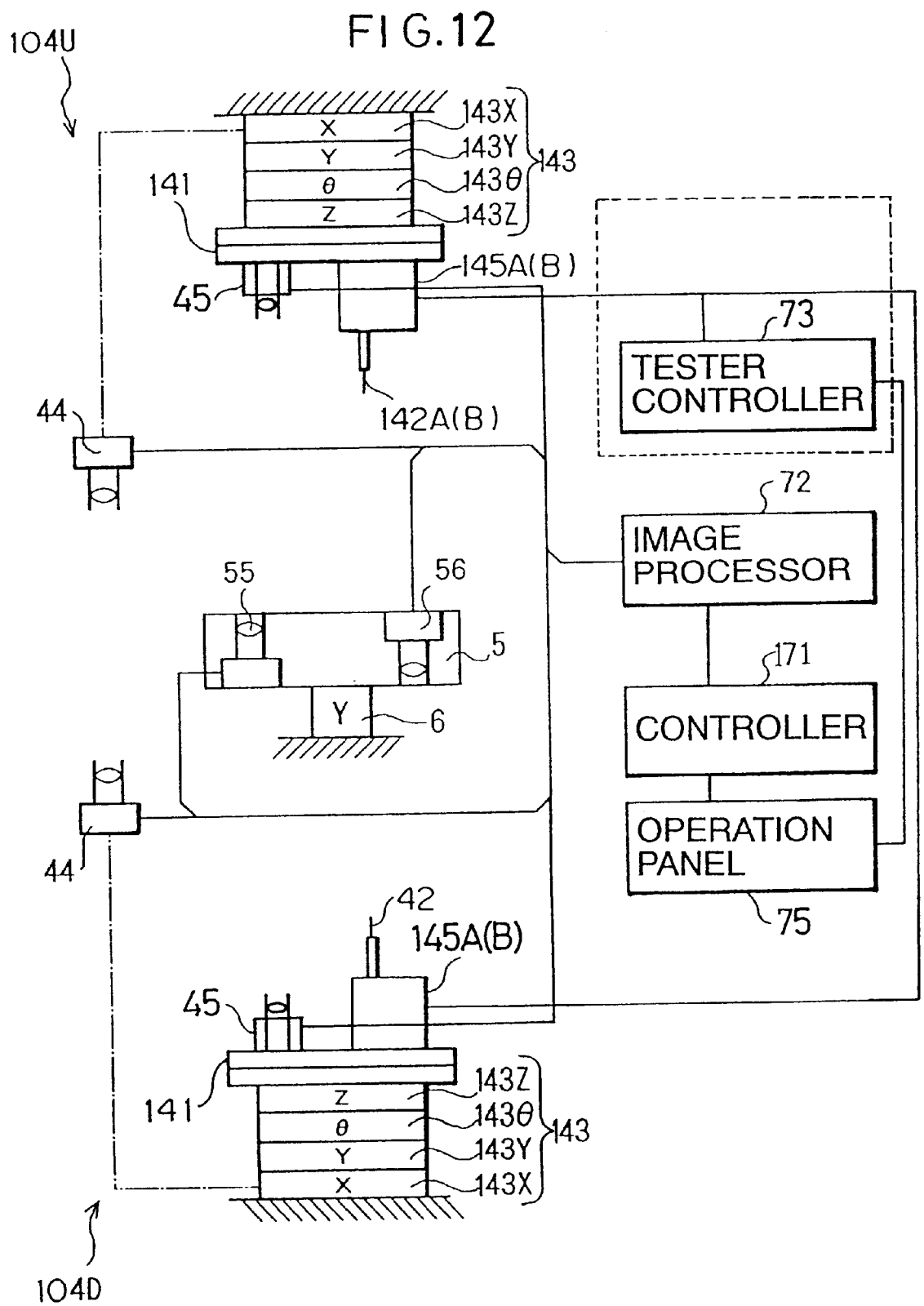
FIG. 12 is a diagram showing a main construction of a circuit board testing apparatus as a second embodiment of the present invention.
Figure 13:
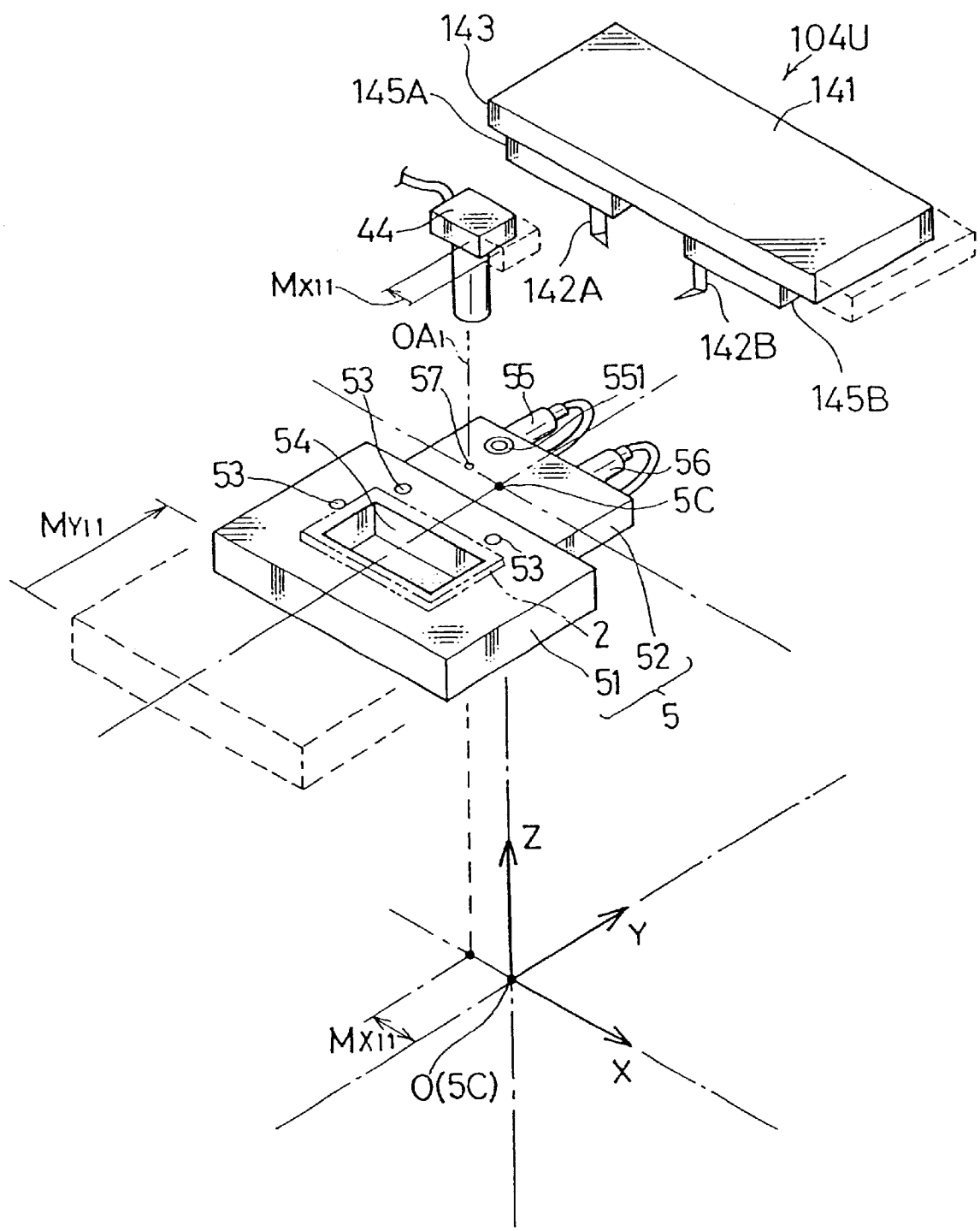
FIG. 13 is a perspective view showing an operation of the circuit board testing apparatus of the second embodiment.

More specifically, as shown in FIG. 11, an image of the board positioning mark 2A of the circuit board 2 on the transfer table 5 is first picked up by the confirmation camera 45 through the through hole 46. A displacement of the board positioning mark 2A from a specified position (e.g., a center) of the through hole 46 is calculated based on image signals obtained by the confirmation camera 45 (Step S91). It is judged in Step S92 whether a calculated amount of displacement is in an allowable range. If the calculated displacement is in the allowable range (YES in Step S92), the flow proceeds to Step S10 of the main routine shown in FIG. 6 with no further testing positional checks being done. On the other hand, if the calculated amount of displacement is out of the allowable range (NO in Step S92), positional correction is carried out to render the displacement between the through hole 46 and the board positioning mark 2A to come into the allowable range (Step S93). When the positional correction is carried out, the test head 41 is lifted up. After the correction is completed, the Z-head drive section 43Z is controlled to move the test head 41 so that the contacts 42 of the test head 41 come into contact with the circuit pattern of the circuit board 2, and testing is performed again using the scanner 74 (Step S94).

This increases the testing accuracy because of the fact that even if any displacement between the test head 41 and the circuit board 2 occurs due to the contact of the contacts on the circuit pattern, the displacement is properly corrected to set the circuit board 2 and the test head 41 in the corrected positional relationship for testing.

Upon completion of the circuit board test, a test result is displayed, and the tested circuit board 2 is returned to the initial position 3. Subsequently, it is judged whether there is another circuit board to be tested (Step S10). If it is judged that there is another circuit board 2 (YES in Step S10), the flow returns to Step S1 to repeat the series of operations. On the other hand, if it is judged that there is no circuit board to be tested (NO in Step S10), the flow ends.

Next, a circuit board testing apparatus according to a second embodiment of the present invention will be described with reference to FIGS. 12 to 17. In the circuit board testing apparatus of the second embodiment, parts or elements which are given the same reference characters as the first circuit board testing apparatus have similar functions, and description of them is thus omitted.

The circuit board testing apparatus of the first embodiment is adapted for the use of a test head having fixed contacts or probes arranged to be exclusively applicable for a particular type of circuit board. The circuit board testing apparatus of the second embodiment is mounted with a test head having the so-called flying probes or movable contacts. The circuit board testing apparatus of the second embodiment is preferable for testing a variety of types of circuit boards, wherein the number of circuit boards of the same circuit pattern is small.

The circuit board testing apparatus of the second embodiment includes, similarly to the first embodiment, an upper tester unit 104U for testing a circuit pattern formed on a top of a circuit board 2 and a lower tester unit 104D for testing a circuit pattern formed on an underside of the circuit board 2. The tester units 104U and 104D both have the same configuration and are symmetrically disposed with the travel path of the transfer table 5.

The upper tester unit 104U includes a test head 141 provided with a pair of contacts 142A and 142B. The contacts 142A and 142B extend toward the transfer table 5, and are moved by contact drivers 145A and 145B, respectively. After being positioned relative to the circuit board 2 on the transfer table 5 as described later, the contacts 142A and 142B are brought into contact with predetermined points on the circuit pattern of the circuit board 2 by a test head drive mechanism 143 and the contact drivers 145A and 145B under the control of the controller.

The test head drive mechanism 143 includes an X-head drive section 143X, a Y-head drive section 143Y, a θ-head drive section 143θ, and a Z-head drive section 143Z. Those sections have functions similar to the corresponding sections of the test head drive mechanism 43 of the first embodiment to thereby move the test head 141 relative to the transfer table 5.

The contact driver 145A (145B) is attached to the test head 141, and provided with a mechanism for moving the contact 142A (142B) in the X-, Y-, and Z-directions. The contact drivers 145A and 145B are controlled by a tester controller 73 to move the contacts 142A and 142B in lateral directions, and move them toward and away from the circuit pattern formed on the circuit board 2.

Also, a main camera 44 is mechanically connected to the X-head drive section 143X so as to move in the X direction integrally with the test head 41. Further, a match confirmation camera 45 is provided on the test head 141.

The transfer table 5 has a similar construction to the circuit board testing apparatus of the first embodiment.

However, auxiliary camera 55 (56) is adapted for picking up an image of a tip of the contacts 142A and 142B of the test head 141 in the tester unit 104U (104D).

An electrical configuration of the circuit board testing apparatus of the second embodiment is similar to that of the first embodiment. However, this apparatus is not provided with a scanner for selectively supplying a test signal to each one of a plurality of contacts. Test results are given to the controller 171 through the tester controller 73.

Figure 14:
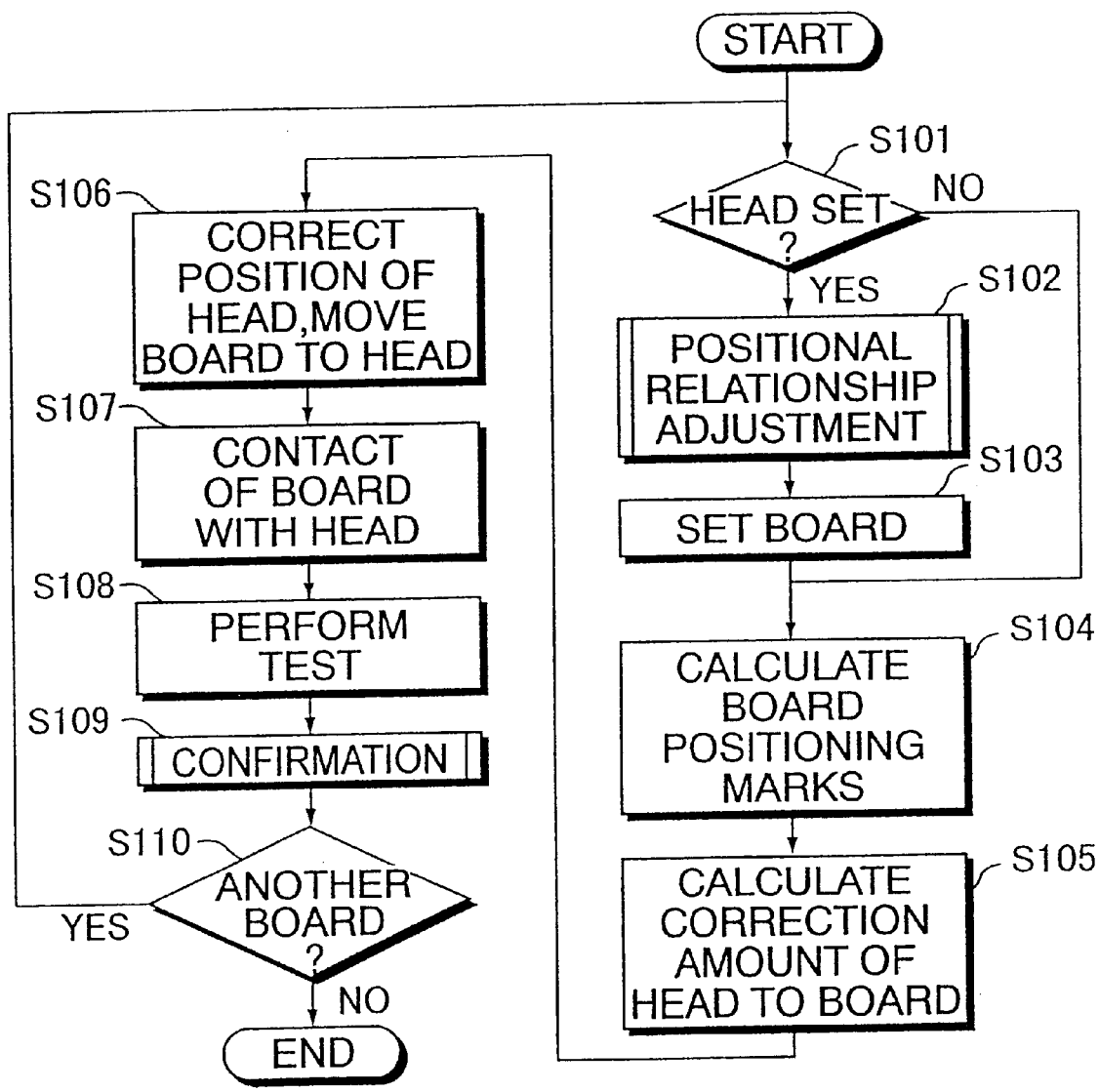
FIG. 14 is a flowchart showing a main operation of the circuit board testing apparatus of the second embodiment.
Figure 15:
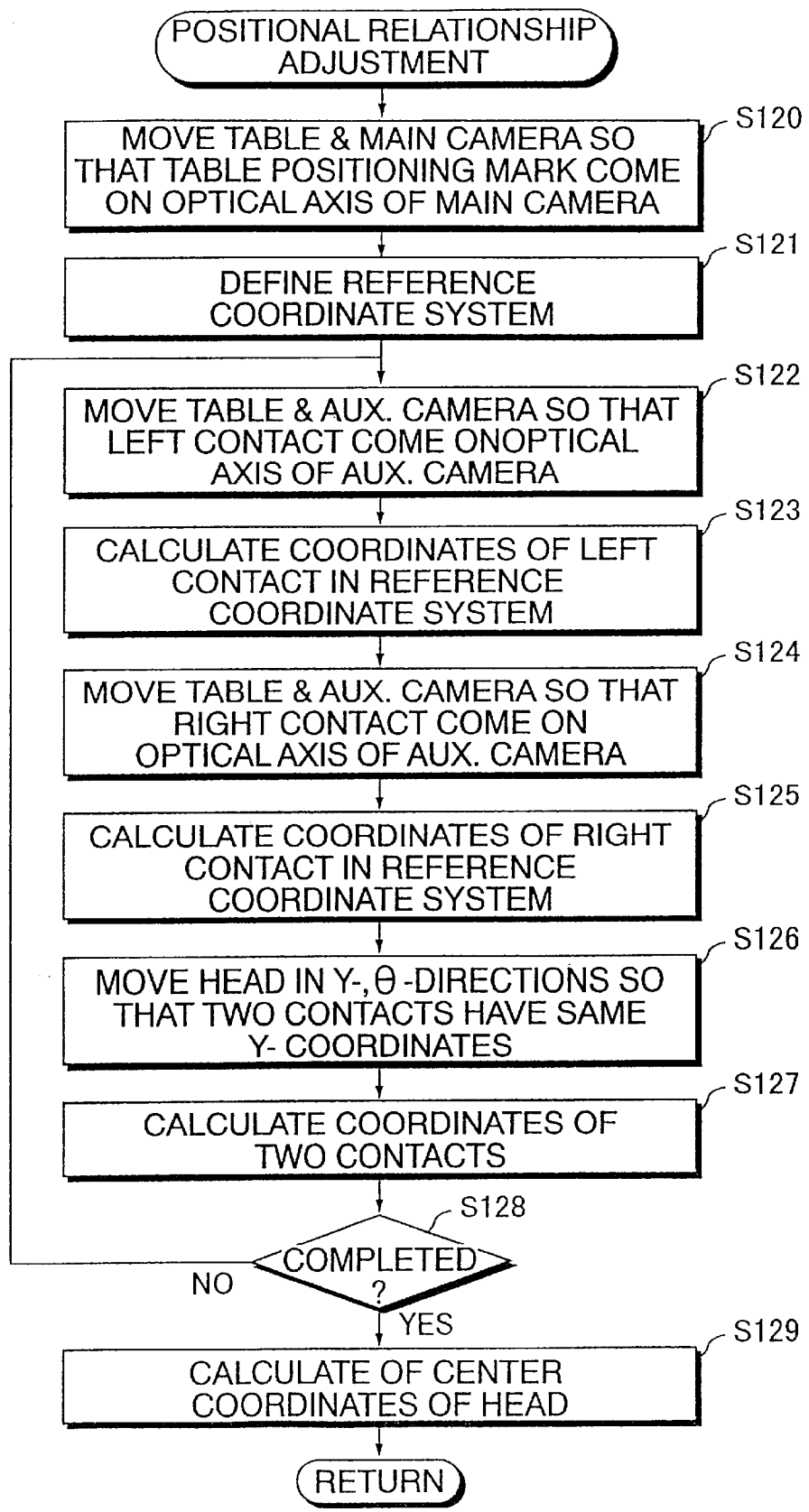
FIG. 15 is a flowchart showing the process of adjusting the positional relationship carried out in the circuit board testing apparatus of the second embodiment.
Figure 16:
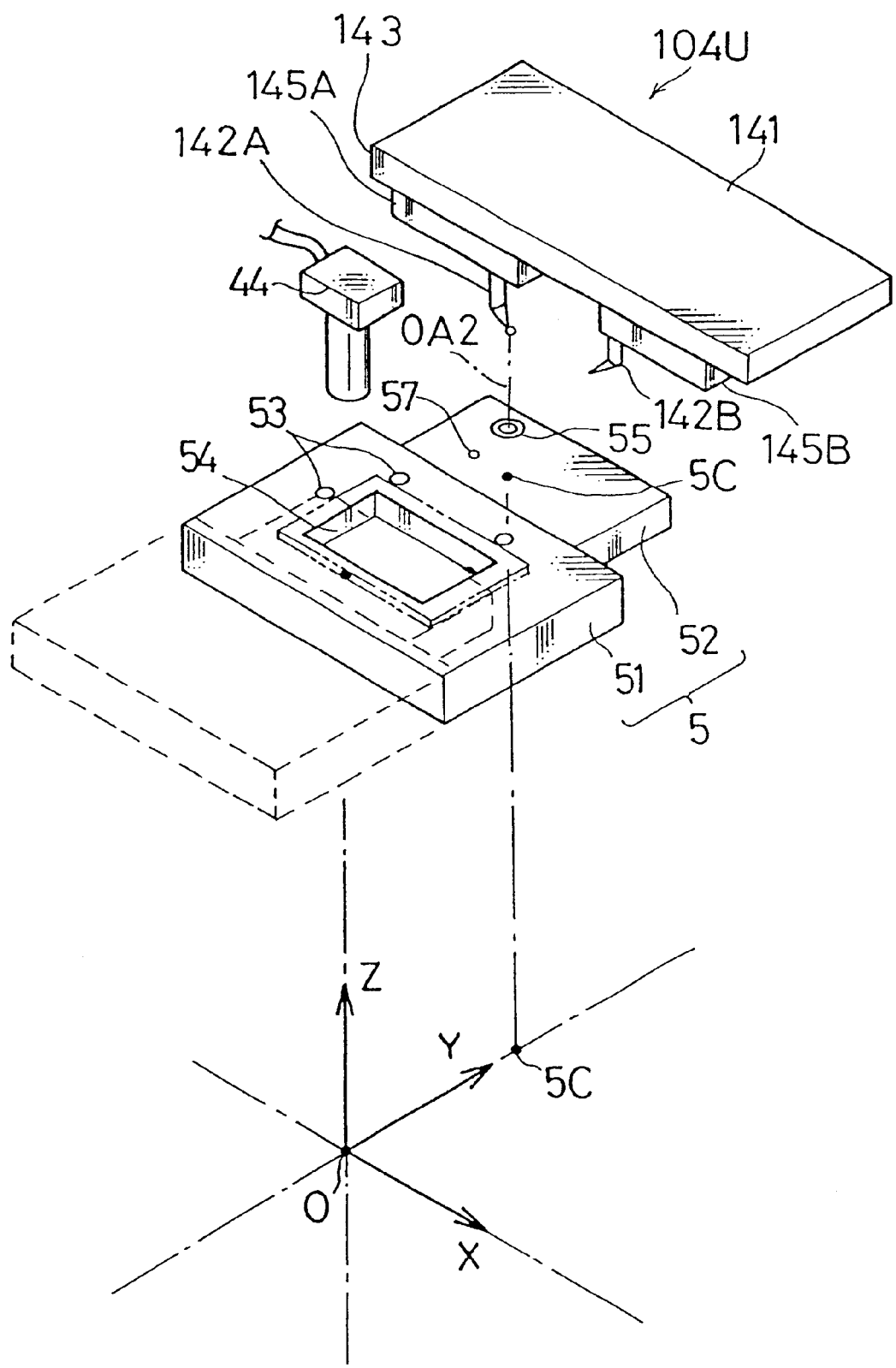
FIG. 16 is a perspective view showing another operation of the circuit board testing apparatus of the second embodiment.

Next the operations of the circuit board testing apparatus of the second embodiment will be described with reference to FIGS. 14 and 15. Upon receiving a test command, the controller 171 judges whether or not new contacts 142A and 142B or a new test head 141 have been set (Step S101). If no replacement is executed ("NO" in Step S101), the flow proceeds to Steps S103 to S110 where the same operations are executed as in the first embodiment. Accordingly, detailed description of those operations is omitted.

On the other hand, if it is judged to be "YES" in Step S101, the adjustment of the positional relationship is executed in Step S102. The adjustment of the positional relationship is basically similar to that of the first embodiment as shown in FIG. 15.

The transfer table drive mechanism 6 and the X-head drive section 143X are driven based on image signals obtained by the main camera 44 so that the table positioning mark 57 comes onto the optical axis $OA_1$ of the main camera 44 (Step S120). At this state, a hypothetical reference coordinate system is defined with its origin O being coincident with the designed center 5C of the transfer table 5 (Step S121).

The transfer table drive mechanism 6 and the X-head drive section 143X are driven based on image signals obtained by the auxiliary camera 55 so that the tip of the contact 142A attached on the test head 141 comes onto the optical axis $OA_2$ of the auxiliary camera 55 (Step S122). In this time, the contact 142A is held at an initial position pre-defined on the test head 141. Coordinates $(X_{A10}, Y_{A10})$ of the contact 142A with respect to the reference coordinate system is determined by the amount of movement of the transfer table 5 and the test head 141 (Step S123).

Coordinates of the contact 142B in the reference coordinate system is determined in the same manner as Steps S122 and S123. Specifically, the transfer table drive mechanism 6 and the X-head drive section 143X are driven based on image signals obtained by the auxiliary camera 55 so that the tip of the contact 142B comes onto the optical axis $OA_2$ of the auxiliary camera 55 (Step S124). In this time, the contact 142B is held at an initial position pre-defined on the test head 141. Coordinates $(X_{B10}, Y_{B10})$ of the contact 142B with respect to the reference coordinate system is determined by the amount of movement of the transfer table 5 and the test head 141 (Step S125).

Figure 17:
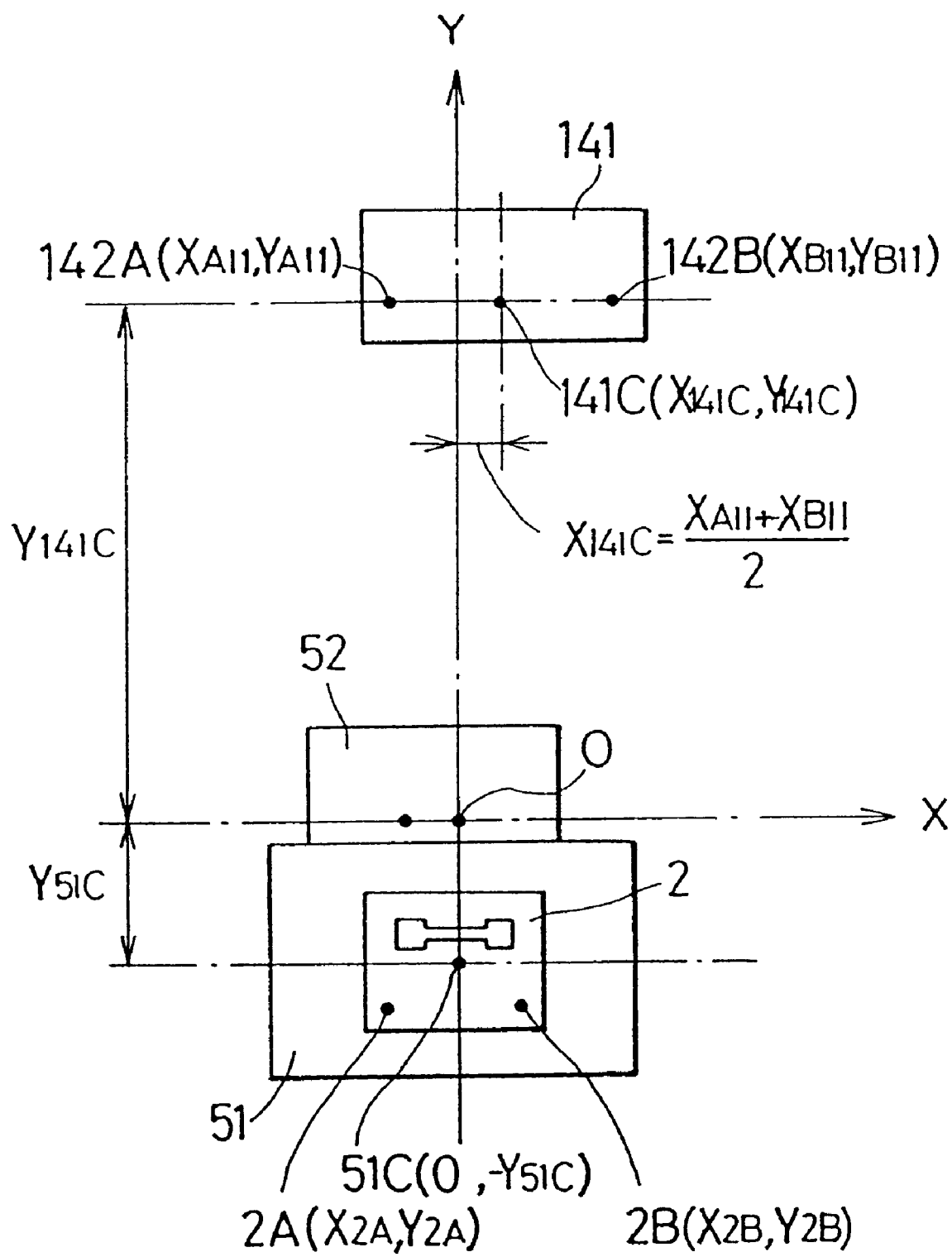
FIG. 17 is a diagram showing a positional relationship between a test head and a transfer table in the circuit board testing apparatus of the second embodiment.

The Y-head drive section 143Y and the θ-head drive section 143θ are driven so that the two contacts 142A and 142B have the same coordinate with respect to the Y-coordinate (Step S126). Respective coordinates of the contacts 142A and 142B with respect to the reference coordinate system are calculated as follows (Step S127):

Coordinates of the contact 142A $(X_{A11}, Y_{A11})$
Coordinates of the contact 142B $(X_{B11}, Y_{B11})$ In Step S128, it is judged whether the test head 141 is corrected in the Y-direction and the θ-direction. If the correction is judged not to be completed, the flow returns to Step S122 to perform the operations of Steps S122 to S127. On the other hand, if the correction is judged to be completed, coordinates $(X_{141C}, Y_{141C})$ of a center 141C of the test head 141 are calculated (Step S129). The center 141C of the test head 141 is shown in FIG. 17. The coordinates ($X_{141C}$, $Y_{141C}$) of the center 141C can be expressed as follows:

$$X_{141C}=(X_{A11}+X_{B11})/2$$

$$Y_{141C}=Y_{A11}=Y_{B11}$$

These coordinates are stored in the memory of the controller 171 until the test head 141 or the contacts 142A, 142B are replaced with another test head or contacts. After the adjustment of the positional relationship between the transfer table 5 and the test head 141, the flow returns to Step S102 of the main flow, and executes the operations of Steps S103 to S110.

In the second embodiment described above, both upper and lower test heads 145A and 145B are of the type having a pair of flying contacts or moving probes, but one of the test heads 145A or 145B, preferably the lower test head 145B may be of the type provided with fixed contacts.

As described above, in the foregoing embodiments, the auxiliary cameras 55 and 56 are mounted on the transfer table 5. An image of the table positioning mark 57 provided on the transfer table 5 is picked up by the main camera 44 to define the reference coordinate system. An image of the head positioning marks 47A and 47B (or tips of the contacts 142A and 142B) of the test head 41 is picked up by the auxiliary cameras 55 to determine a relative position between the transfer table 5 and an the test head 41 (141) with respect to two dimensions and angular direction. The positional relationship between the test head 41 (141) and the transfer table 5 is adjusted based on the relative position thus determined.

Further, a displacement of the circuit board 2 from its standard position on the transfer table 5 is calculated based on an image signal of the board positioning marks 2A and 2B obtained by the main camera 44, and correction based on the calculated amount of displacement is added to the amount of drive of the table transport mechanism and the test head drive mechanism 43 (143). Therefore, this eliminates the trial and error adjustment by the operator which is required in the conventional apparatus, and enables automatic testing of the circuit board, thus reducing the work load on the operator.

Further, since the circuit pattern of the circuit board 2 and the contacts are made to come into contact with each other under the thus corrected positional relationship, the contacts correctly come into contact with specified positions or points of the circuit pattern of the circuit board 2, thus ensuring accurate circuit board testing.

In the foregoing embodiments, the main camera 44 is mechanically connected with the X-head drive section 43X (143X), and thus is movable in the X-direction. However, it should be appreciated that a drive mechanism can be provided for exclusive use to drive the main camera 44 in the X-direction, so that the main camera 44 is movable independently of the test head 41 (141).

In this case, the reference coordinate system is associated with the stationary part of the apparatus, such as the frame or bracket of the apparatus. Thus, the coordinate system may be referred to as an absolute coordinate system. The absolute coordinate system defines the coordinates of the head positioning marks 47A and 47B (or tips of the contacts 142A and 142B), as well as the coordinates of the board positioning marks.

Furthermore, instead of allowing the main camera 44 to move in the X-direction, it may be appreciated to make the transfer table 5 movable in the X-direction.

In the foregoing embodiments, the test head 41 is adjusted in two dimensions, i.e., X- and Y-directions and the angular direction, after the coordinates $XA_0$, $YA_0$, $XB_0$, $YB_0$ of the head positioning marks 47A and 47B are determined such that the Y-coordinates of the marks are equal to each other. Then, the coordinates $XA_1$, $YA_1$, $XB_1$, $YB_1$ of the head positioning marks 47A and 47B are determined with the test head having been adjusted to determine a target relative position. However, the relative position of the table 5 and the test head 41 may be adjusted collectively or accumulatively when the table 5 carrying a circuit board to be tested is brought into a test position.

In the foregoing embodiments, furthermore, the adjustment of the positional relationship is carried out only when a test head 41 (141) or the contacts 142A, 142B are newly set. However, there is a likelihood that the optical axis of the main camera 44 shifts with time during repeated test operation by the same test head. Accordingly, it should be appreciated that the positional relationship should be adjusted before testing every circuit board or a specified number of circuit boards, thereby increasing the testing accuracy.

Further, in the foregoing embodiments, description has been made with reference to the circuit board testing apparatus which executes testing for both surfaces of a circuit board at the same time. However, the present invention is not limited to such an apparatus, but is also applicable to a circuit board testing apparatus which executes testing for one surface of a circuit board at a time.

Still further, in the foregoing embodiments, the relative position between the table 5 and the test head 41 (141) is identified by a combination of a camera and a fixed mark. However, other means for the identification is available, such as a combination of a narrow light beam and a two dimensional position sensor. Also, the present invention is applicable to various types of test heads.

In the foregoing embodiments, all the contacts or probes are fixed on the head and are brought into contact with the circuit pattern. The pair of flying probes 142A and 142B are brought into contact with various points on the circuit pattern. The present invention is applicable to the type wherein a set of fixed contacts are to be brought into contact with particular points of the circuit pattern while a single electrode or a plurality of electrodes confronts the circuit pattern with a gap such that the electrode or electrodes are electrically coupled with the circuit pattern though which rapidly changing electric signals may pass be detected. The signal may change its voltage or electric current in a sine wave form, pulse wave form or in the form of turning on or off of an electric voltage or current. The electric coupling may also be of a capacitance or an induction coupling.

As this invention may be embodied in several forms without departing from the spirit of essential characteristics thereof, the foregoing embodiments are is therefore illustrative and not restrictive, since the scope of the invention is defined by the appended claims rather than by the description preceding them, and all changes that fall within the metes and bounds of the claims, or equivalents of such meets and bounds are therefore intended to be embraced by the claims.

What is claimed is:

1. A printed circuit board testing apparatus for testing conductivity between particular points on a circuit pattern of a printed circuit board, the printed circuit board having a pair of board reference marks, the apparatus comprising:

a table for carrying the circuit board to be tested;

a table transport system for transporting the table in a first direction;

a test head provided with at least a pair of probes which are to be in contact with the particular points on a circuit pattern, the test head having a pair of head reference marks;

a test head driving system for driving the test head in the first direction, in a second direction perpendicular to the first direction and in an angular direction;

a reference position identifying system for identifying a reference position of the table and determining the origin of a reference coordinate system in connection with the reference position of the table;

a first detector for detecting the head reference marks while the table driving system and the test head driving system drive the table and the test head relative to each other;

a first measuring system for determining relative positions of the table and the test head at the time the head reference marks are respectively detected, the relative position being determined in reference to the reference coordinate system as a function of an amount of driving of the table and the test head from their reference and original positions;

a second detector for detecting the board reference marks while the table driving system and the test head driving system drive the table and the test head relative to each other;

a second measuring system for determining the deviation of the circuit board on the table from its standard position with reference to the coordinate system as a function of an amount of driving of the table and the second detector from their reference and original positions to the position where the board reference marks are detected; and a controller for controlling the table transport system and the test head driving system to bring the table and the test head into a matched relative test position in accordance with the relative positions of the table and the test head determined by the first measuring system and the deviation determined by the second measuring system.

2. A printed circuit board testing apparatus according to claim 1, wherein said reference position identifying system includes a first camera moveable in the second direction, and a table positioning mark fixedly formed on the table, the reference position being determined when the table positioning mark is on the optical axis of the first camera.

3. A printed circuit board testing apparatus according to claim 2, wherein the first camera also serves as the second detector.

4. A printed circuit board testing apparatus according to claim 2, wherein said test head driving system includes a first direction drive section for driving the test head in the first direction and a second direction drive section for driving the test head in the second direction, and the first camera is mechanically connected with the second direction drive section.

5. A printed circuit board testing apparatus according to claim 1, wherein said test head is provided with a pair of probes respectively moveably mounted on the test head to be brought into contact with a plurality of test points on the circuit board, and said first detector detects the head reference marks as the initial positions of the probes.

6. A printed circuit board testing apparatus according to claim 1, wherein said first detector includes a second camera fixed on the table.

7. A printed circuit board testing apparatus according to claim 1, further comprising a third camera provided on the test head to pick up an image of one of the board reference marks when the test head and table are in their circuit board testing relative positions, to confirm the relative position.

8. A printed circuit board testing apparatus according to claim 1, further comprising an adjusting mechanism for adjusting the position of the test head relative to the table with respect to the first and second and angular directions such that the coordinates in the first direction and representing the relative positions determined by the first measuring system become equal to each other.

9. A printed circuit board testing apparatus according to claim 1, wherein the test head is a first test head and the apparatus further comprising a second test head, wherein the first test head is located above the table and the second test head is located under the table.

10. A printed circuit board testing apparatus according to claim 9, wherein the table has an opening in the middle for allowing the printed circuit board to be tested on both sides simultaneously.

11. A method for adjusting the relative position of a circuit board to be tested and a test head of a circuit board testing apparatus, the circuit board being formed with a circuit pattern and carried by a table which is moveable in a first direction between an initial position where the circuit board is set on the table and a test position where the circuit board is tested, and the test head being provided with a plurality of probes to be electrically connected with particular points of the circuit pattern and detect conductivity therebetween and the test head being driven in the first direction, in a second direction perpendicular to the first direction and in an angular direction, the method comprising the steps of:

positioning the table at a reference position to determine a coordinate system measured in the first and second directions, with the origin being associated with the reference position;

driving the table and the test head to a first alignment position and determining coordinates of the relative position of the table and the test head with reference to the coordinate system as a function of the amount of the movement of the table from the reference position and the test head from an initial position, calculating, from the coordinates, an amount of relative movement of the table and the test head to reach a matched test position relative to each other;

determining the deviation of the circuit board on the table from a standard position with reference to the coordinate system;

adjusting the amount of relative movement in accordance with the deviation; and controlling the relative movement of the table and the test head in accordance with the adjusted amount.

12. A method according to claim 11, wherein the relative positions of the table and the test head are first relative positions of the table and the test head, the test head is provided with a pair of head reference marks, the table is provided with a mark detector, and said step of driving the table and the test head to a first alignment position and determining coordinates includes a first sub-step of driving the table and the test head to the first relative positions where the mark detector aligns with one of the head reference marks, a second sub-step of determining the coordinates of the first relative positions, a third sub-step of driving the table and the test head to second relative positions where the mark detector aligns with the other head reference mark, and a fourth sub-step of determining the coordinates of the second relative positions.

13. A method according to claim 11, wherein the circuit board testing apparatus is provided with a camera moveable in the second direction, and the table is provided with a table reference mark, and the step of positioning the table includes sub-steps of driving the table and the camera until the table reference mark aligns with an optical axis of the camera.

14. A method according to claim 13, wherein the circuit board is provided with a pair of board reference marks, and the step of determining the deviation of the circuit board includes sub-steps of driving the table and the camera to their respective relative positions where the board reference marks align with the optical axis of the camera, determining coordinates of the relative positions of the circuit board on the table and the camera, calculating the deviation from the difference of the determined coordinates of the relative position of the camera and the circuit board from the coordinates of predetermined standard positions.

15. A method according to claim 11, wherein the relative positions of the table and the test head are first relative positions of the table and the test head, and the method further comprises the step of:

driving the table and the test head to a second alignment position and determining coordinates of second relative positions of the table and the test head with reference to the coordinate system as a function of the amount of the movement of the table and the test head from the respective first relative positions.

* * * * *